(12) United States Patent
Kashmiri et al.

(10) Patent No.: US 9,714,987 B2
(45) Date of Patent: Jul. 25, 2017

(54) FLUXGATE MAGNETIC-TO-DIGITAL CONVERTER WITH OVERSAMPLING CLOSED LOOP

(71) Applicant: Texas Instruments Incorporated, Dallas, TX (US)

(72) Inventors: Sayyed Mahdi Kashmiri, Delft (NL); Willem J. Kindt, Berkel en Rodenrijs (NL)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 449 days.

(21) Appl. No.: 14/222,231

(22) Filed: Mar. 21, 2014

(65) Prior Publication Data

US 2014/0285189 A1 Sep. 25, 2014

Related U.S. Application Data

(60) Provisional application No. 61/804,120, filed on Mar. 21, 2013.

(51) Int. Cl.
*G01R 33/04* (2006.01)
*G01R 33/00* (2006.01)

(52) U.S. Cl.
CPC ......... *G01R 33/04* (2013.01); *G01R 33/0041* (2013.01)

(58) Field of Classification Search
None
See application file for complete search history.

(56) References Cited

U.S. PATENT DOCUMENTS

2007/0188168 A1* 8/2007 Stanley .............. B60R 21/0136
324/228
2014/0184214 A1* 7/2014 Schaffer ................ G01R 33/04
324/253

OTHER PUBLICATIONS

S. Kawahito, A. Cerman and Y. Tadokoro, "A digital fluxgate magnetic sensor interface using sigma-delta modulation for weak magnetic field measurement," Instrumentation and Measurement Technology Conference, 2002. IMTC/2002. Proceedings of the 19th IEEE, 2002, pp. 257-260 vol. 1 (Published May 2002).*

* cited by examiner

*Primary Examiner* — Melissa Koval
*Assistant Examiner* — Felicia Farrow
(74) *Attorney, Agent, or Firm* — Andrew Viger; Charles A. Brill; Frank D. Cimino

(57) ABSTRACT

A fluxgate sensor including a magnetic-to-digital converter (MDC) can be adapted to measure an external magnetic field $B_{EXT}$ with a bandwidth $f_B$. The MDC forward path can include: (a) converting an analog sense signal from the fluxgate sense coil to corresponding oversampled digital data using an oversampling data converter with an oversampling frequency $f_S$ greater than $f_B$; and (b) loop filtering the oversampled digital data, synchronous with the oversampling frequency $f_S$, to generate the loop output digital data. The MDC feedback path can include: (a) generating the feedback compensation current $I_{COMP}$ from the loop output digital data, synchronous with a feedback path frequency $f_{FB}$ equal to $((M/N) \times f_S)$, where M and N are integers; and (b) injecting the feedback compensation current $I_{COMP}$ into the fluxgate compensation coil to induce the compensation field $B_{COMP}$, such that the induced compensation field $B_{COMP}$ nulls the external field $B_{EXT}$.

31 Claims, 14 Drawing Sheets

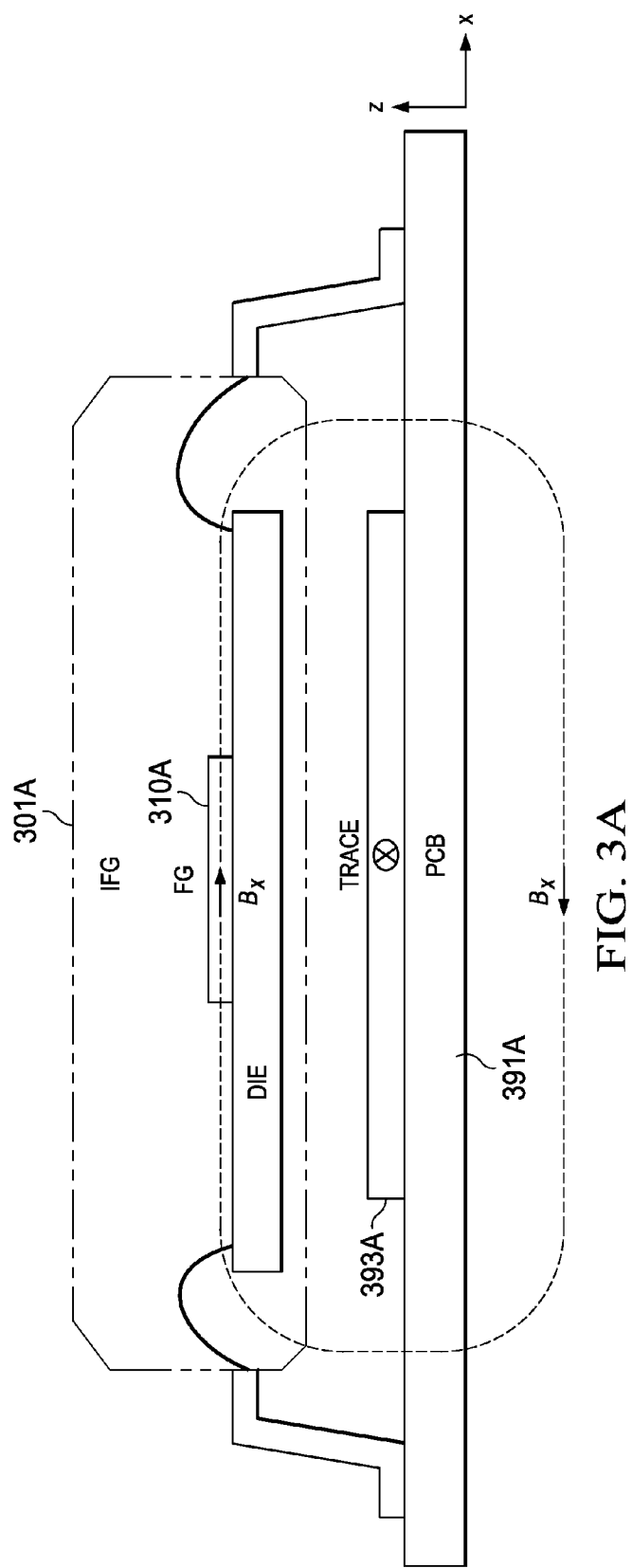

FLUXGATE MAGNETIC-TO-DIGITAL CONVERTER WITH OVERSAMPLING CLOSED LOOP

CROSS-REFERENCE TO RELATED APPLICATIONS

Priority is hereby claimed under USC §119(e) to U.S. Provisional Application 61/804,120 (filed Mar. 21, 2013).

BACKGROUND

Technical Field

This Patent Document relates generally to fluxgate magnetic field sensing, either single ended or differential, such as can be used for contactless current sensing.

Related Art

Fluxgate sensors measure (sense) a magnetic field generated by an external field source (field of interest) at the location of the sensor. This external field of interest can be referred to as an external, target field $B_{EXT}$.

Differential fluxgate sensor topologies, with dual fluxgate elements, can be configured to sense differential components of a target $B_{EXT}$ field. In such applications, any stray field $B_{STRAY}$ (for example, the Earth's magnetic field) will appear in common mode, and will be rejected by the differential fluxgate sensor.

A fluxgate sensor includes a fluxgate magnetics element and fluxgate readout circuitry. The fluxgate magnetic element includes a magnetically susceptible core with an excitation coil, and a sense coil coupled to the fluxgate readout circuitry. The excitation coil is driven by an electrical excitation current $I_{EXC}$ at an excitation frequency $f_{EXC}$, driving the core through alternating cycles of positive and negative magnetic saturation (B-H loop), and inducing corresponding $V_{SENSE}$ voltage pulses in the sense coil.

The fluxgate sensor is disposed at a location/source of the target external field, with the fluxgate magnetics element arranged for magnetic coupling to the target $B_{EXT}$ field, with the magnetics geometry oriented to measure the target $B_{EXT}$ field in a selected direction, which can be referred to as the axis of sensitivity (for example, the x-axis). Fluxgate core saturation will then align with $B_{EXT}$, resulting in a net flux imbalance in the fluxgate core, which is reflected in a corresponding change in $V_{SENSE}$ output. Phase synchronous detection is used to convert this $V_{SENSE}$ output signal to sensor data representative of the $B_{EXT}$ field of interest.

Fluxgate readout circuitry can be configured for open or closed loop operation. For closed loop operation, the fluxgate magnetics element includes a compensation coil. The fluxgate readout circuitry implements a fluxgate control loop including a feedback compensation path that injects an internal compensation current $I_{COMP}$ into the fluxgate compensation coil, inducing in the fluxgate core a feedback-controlled compensation field $B_{COMP}$ to null the target field $B_{EXT}$, so that the internal compensation current $I_{COMP}$ required for field nulling is a measure of $B_{EXT}$, as represented by the sensor data output of the fluxgate control loop.

While single ended sensing can be used if $B_{STRAY}$ fields can be ignored or shielded, a differential fluxgate sensor topology with dual fluxgate sense elements enables differential measurement of the target $B_{EXT}$ field, with the $B_{STRAY}$ field appearing in common-mode. The differential fluxgate sensor includes a common-mode loop that nulls (suppresses) the common-mode $B_{STRAY}$ field in the fluxgate cores, and a differential-mode loop that measures a differential field $B_{EXT}$ by generating feedback-controlled differential $B_{COMP}$ fields to null the respective differential components of the $B_{EXT}$ field appearing in respective fluxgate cores.

One application for fluxgate sensing is contactless current sensing, eliminating the need for a shunt resistor or other in-circuit element. For example, the fluxgate sensor can be placed on a PCB over or adjacent to a PCB trace to effect magnetic coupling between the fluxgate core and the $B_{EXT}$ field induced by current flow through the PCB trace.

BRIEF SUMMARY

This Brief Summary is provided as a general introduction to the Disclosure provided by the Detailed Description and Figures, summarizing some aspects of the disclosed invention. It is not a detailed overview of the Disclosure, and should not be interpreted as identifying key elements of the invention, or otherwise characterizing the scope of the invention disclosed in this Patent Document.

The Disclosure describes apparatus and methods for fluxgate sensing according to the invention, adaptable for measuring an external magnetic field $B_{EXT}$ with a bandwidth $f_B$. In one application, fluxgate sensing according to the invention can be adapted to sensing current, such as current flow in PCB (printed circuit board) traces.

The methodology for fluxgate sensing according to the Disclosure is useable with a fluxgate sensor with at least one fluxgate magnetics element including a fluxgate core with an excitation coil, a compensation coil and a sense coil, where the fluxgate excitation coil is driven with an excitation current $I_{EXC}$ with an excitation frequency $f_{EXC}$.

Embodiments of the methodology can include implementing a magnetics-to-digital (MDC) control loop with forward and feedback paths. The MDC control loop receives from the fluxgate sense coil an analog sense signal induced by a sense field in the fluxgate core that corresponds to a difference between the external field $B_{EXT}$ and a compensation field $B_{COMP}$, and includes: (a) in the forward path, converting the analog sense signal into loop output digital data corresponding to sensor data representative of the external field $B_{EXT}$, and (b) in the feedback path, converting the loop output digital data into a feedback compensation current $I_{COMP}$ for injection into the fluxgate compensation coil to induce a field-nulling $B_{COMP}$ field. Forward path operations can include: (a) converting the analog sense signal to corresponding oversampled digital data using an oversampling data converter with an oversampling frequency $f_S$ greater than $2f_B$ (the Nyquist rate); and (b) loop filtering the oversampled digital data, synchronous with the oversampling frequency $f_S$, to generate the loop output digital data. Feedback path operations can include: (a) generating the feedback compensation current $I_{COMP}$ from the loop output digital data, synchronous with a feedback path frequency $f_{FB}$ equal to $(M/N) \times f_S$ (M and N are integers); and (b) injecting the feedback compensation current $I_{COMP}$ into the fluxgate compensation coil to induce the compensation field $B_{COMP}$, such that the induced compensation field $B_{COMP}$ nulls the external field $B_{EXT}$.

In other embodiments, in the forward path, the analog sense signal can be band limited to prevent aliasing. In other embodiments, in the feedback path, the feedback $I_{COMP}$ compensation current can be synchronized with one of $f_{EXC}$ and $2 \times f_{EXC}$, such that transitions of the feedback $I_{COMP}$ compensation current are synchronized with fluxgate core saturation cycles. In other embodiments, the oversampling frequency $f_S$ can be an integer multiple of $f_{EXC}$, and the fluxgate sensing methodology can include at least one of: (a) in the forward path, notch filtering the oversampled digital data to suppress frequency components of $f_{EXC}$ and at least one even harmonic $f_{EXC}$, and (b) in the feedback path, notch filtering the noise-shaped digital data to suppress frequency components of $f_{EXC}$ and at least one even harmonic of $f_{EXC}$.

In other embodiments, the fluxgate sensing methodology can be adapted to measure differential components $B_{DM}$ of an external magnetic field $B_{EXT}$ that also includes a stray field common-mode component $B_{CM}$, using two fluxgate magnetics elements including respective magnetic cores with respective excitation, sense and compensation coils, wherein respective excitation coils are driven with respective excitation currents $I_{EXC}$ each at the excitation frequency $f_{EXC}$, and wherein the fluxgate magnetics elements are respectively disposed such that differential components $B_{DM}$ of the external field $B_{EXT}$ magnetically couple into the respective fluxgate cores. This differential fluxgate sensing methodology can include: (a) generating, from the analog sense outputs from respective sense coils, common-mode analog compensation currents $I_{COMP,CM}$ that are injected into respective compensation coils to induce respective common-mode compensation fields $B_{COMP,CM}$ to null the common-mode component $B_{CM}$ of the external field $B_{EXT}$; (b) converting the differential components $B_{DM}$ into representative sensor data, based on differential analog sense signal outputs of respective fluxgate sense coils induced by respective sense fields in respective fluxgate cores, each corresponding to a difference between a differential component $B_{DM}$ of the external field $B_{EXT}$, and a respective compensation field $B_{COMP,DM}$; and (c) configuring the feedback compensation circuitry to generate respective differential feedback compensation currents $I_{COMP,DM}$ that are injected into respective compensation coils to induce respective compensation fields $B_{COMP,DM}$ to null the corresponding differential component $B_{DM}$ of the external field $B_{EXT}$.

In other embodiments, including embodiments in which the forward path does not include perform A/D conversion using oversampling, but includes an analog integration function before, or a digital integration function after, A/D conversion, the feedback path can be configured to convert the loop output digital data into the feedback compensation current $I_{COMP}$ by: (a) noise-shaping the MDC loop output digital data, synchronized with a feedback frequency $f_{FB}$ equal to $((M/N) \times f_S)$, to provide noise-shaped digital data; (b) delaying the noise-shaped digital data by a predetermined delay, and providing time-delayed digital data; (c) performing a sample-and-hold operation, synchronized with one of $f_{EXC}$ and $2 \times f_{EXC}$, to latch the time-delayed digital data as latched digital data; and (d) converting the latched digital data into the feedback $I_{COMP}$ compensation current, synchronous with one of $f_{EXC}$ and $2 \times f_{EXC}$, using a predetermined number of DAC current sources, each gain-weighted by a predetermined FIR filter impulse response coefficient, such that transitions of the $I_{COMP}$ compensation current are synchronized with fluxgate core saturation cycles.

Other aspects and features of the invention claimed in this Patent Document will be apparent to those skilled in the art from the following Disclosure.

BRIEF DESCRIPTION OF THE DRAWINGS

FIGS. 3A, 3B, 3C illustrate an example application of an integrated (packaged) fluxgate sensor (IFG) including a magnetic-to-digital converter according to the invention, used for contactless current sensing: (3A) illustrates an IFG placed over a PCB trace; (3B) illustrates an IFG sensor in a differential topology with dual fluxgate magnetics elements oriented for x-axis sensitivity, placed over a PCB U-trace; and (3C) illustrates an IFG sensor in a differential topology with dual fluxgate magnetics elements oriented for z-axis sensitivity, placed over a PCB trace.

DETAILED DESCRIPTION

Figure 1A:
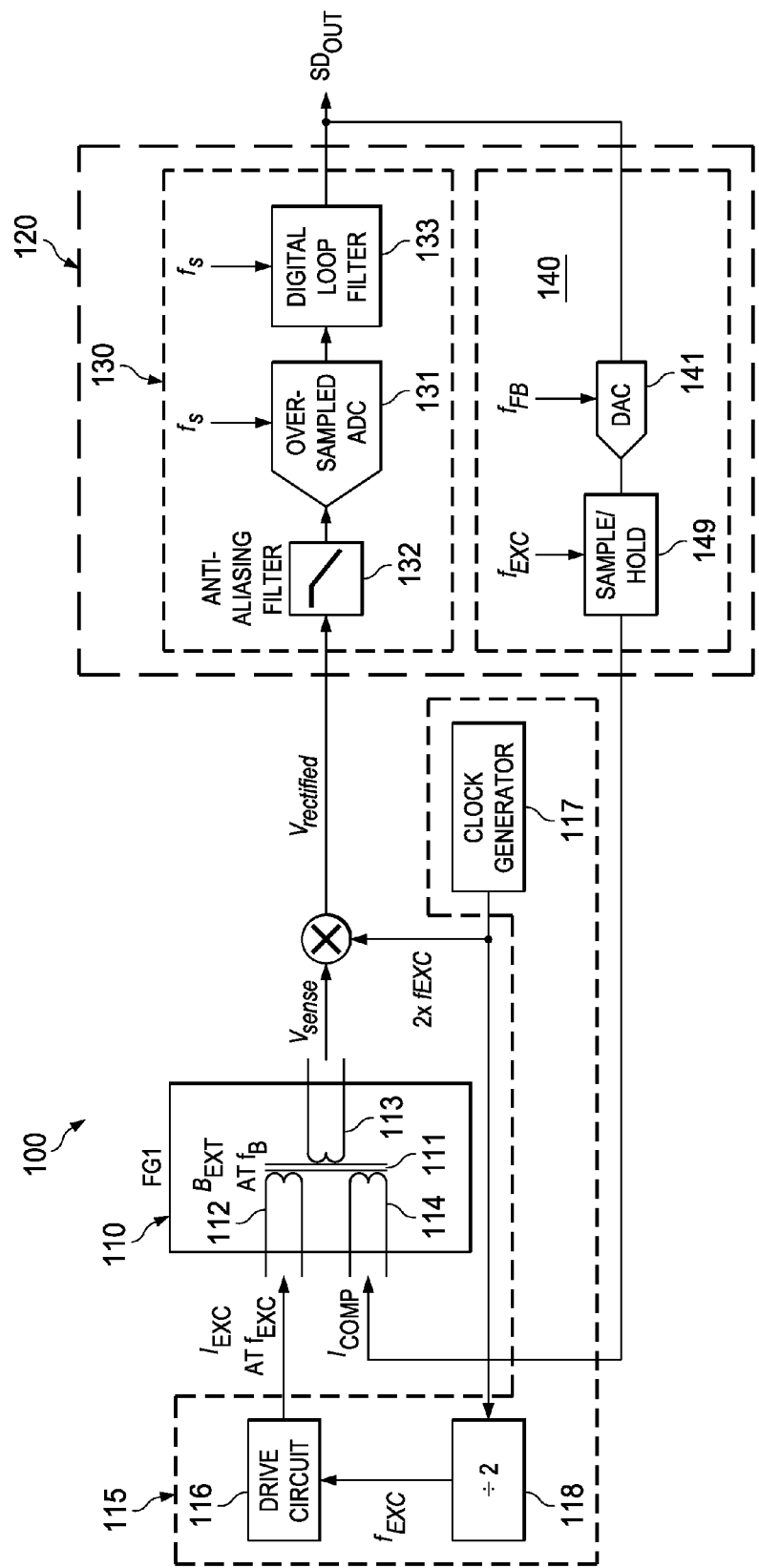
FIG. 1A illustrates an example functional embodiment of a fluxgate sensor adapted to measure (sense) an external magnetic field $B_{EXT}$, including a fluxgate magnetics element, and magnetic-to-digital conversion (MDC) with an MDC control loop, including (a) a forward path with oversampling ($f_S$) A/D conversion, and digital loop filtering, and (b) a feedback compensation path with D/A conversion using a feedback clock $f_{FB}$ synchronous with the oversampling clock $f_S$, where $f_{FB}=(M/N) \times f_S$ (M and N are integers), that injects a compensation current $I_{COMP}$ into the fluxgate compensation coil to induce a compensation field $B_{COMP}$ controlled to null the external $B_{EXT}$ field, such that the feedback-controlled $I_{COMP}$ corresponds to fluxgate sensor data $SD_{OUT}$ representative of the target $B_{EXT}$ field.

This Description and the Figures disclose example embodiments and implementations that illustrate various features and advantages of the invention, aspects of which are defined by the Claims. Known circuits, functions and operations are not described in detail to avoid unnecessarily obscuring the principles and features of the invention.

A fluxgate sensor according to the invention is configured to measure (sense) an external magnetic field $B_{EXT}$. The fluxgate sensor includes a fluxgate magnetics element and a magnetic-to-digital converter (MDC). The fluxgate sensor operates closed loop, with the fluxgate magnetics element including excitation, sense and compensation coils, and with the MDC converter establishing a closed oversampling control loop around fluxgate magnetics element. The MDC control loop outputs fluxgate sensor data (sensor response information) that can be used in measuring (or otherwise sensing) the $B_{EXT}$ field. The fluxgate sensor can be configured in a differential topology for differentially measuring the external $B_{EXT}$ field, while rejecting $B_{STRAY}$ fields that appear in common mode. In an example application, the fluxgate sensor can be adapted for contactless current sensing.

In brief overview, a fluxgate sensor according to the invention can be adapted to measure an external magnetic field $B_{EXT}$ with a bandwidth $f_B$ using at least one fluxgate magnetics element including a fluxgate core with an excitation coil, a compensation coil and a sense coil, where the excitation coil is driven with an excitation current $I_{EXC}$ with an excitation frequency $f_{EXC}$. The fluxgate sensor includes a magnetic-to-digital (MDC) control loop, including the fluxgate magnetics element, configured to convert the external field $B_{EXT}$ into representative sensor data. The MDC control loop includes forward and feedback paths.

In one embodiment, the MDC forward path is coupled to receive an analog sense signal output of the fluxgate sense coil induced by a sense field in the fluxgate core that corresponds to a difference between the external field $B_{EXT}$, and a compensation field $B_{COMP}$, and configured to provide MDC loop output digital data as the sensor data representative of the external $B_{EXT}$ field, and can include: (a) oversampling ADC (analog-to-digital conversion) circuitry configured to convert the analog sense signal to corresponding oversampled digital data based on an oversampling frequency $f_S$ greater than $2f_B$ (the Nyquist rate); and (b) digital loop filter circuitry synchronized with $f_S$, and configured to filter the oversampled digital data to generate the MDC loop output digital data. The MDC feedback path is coupled to receive the MDC loop output digital data, and coupled to the fluxgate compensation coil, and can include feedback compensation circuitry, synchronized with a feedback path frequency $f_{FB}$ equal to $(M/N) \times f_S$ (M and N are integers), and configured to generate, in response to the MDC loop output digital data, a compensation current $I_{COMP}$ that is injected into the fluxgate compensation coil to induce the compensation field $B_{COMP}$, such that the induced compensation field $B_{COMP}$ nulls the external field $B_{EXT}$, so that the compensation current $I_{COMP}$ corresponds to the sensor data representative of the external field $B_{EXT}$. The MDC forward path can include anti-aliasing circuitry configured to low-pass filter the analog sense signal to provide a band-limited analog sense signal to the oversampling data converter circuitry.

Embodiments of the fluxgate sensor according to the invention can be configured to synchronize the $I_{COMP}$ compensation current with one of $f_{EXC}$ and $2 \times f EXC$, such that transitions of the $I_{COMP}$ compensation current are synchronized with fluxgate core saturation cycles. For such embodiments, in the MDC feedback path, the feedback compensation circuitry is configured to generate, in response to the MDC loop output digital data, a compensation current $I_{COMP}$ that is injected into the fluxgate compensation coil to induce a compensation field $B_{COMP}$ that nulls the external field $B_{EXT}$, so that the compensation current $I_{COMP}$ corresponds to the sensor data representative of the external field $B_{EXT}$, and can include: (a) noise shaping circuitry synchronized with $f_{FB}$ equal to $((M/N) \times f_S)$, and configured to noise-shape the MDC output sensor digital data to provide noise-shaped digital data; and (b) FIR DAC circuitry, including (i) time delay circuitry configured to delay the noise-shaped digital data by a predetermined delay, and provide time-delayed digital data, (ii) digital sample/hold circuitry synchronized with one of $f_{EXC}$ and $2 \times f_{EXC}$, and configured to latch the time-delayed digital data as latched digital data, and (iii) a predetermined number of DAC current sources, each gain-weighted by a predetermined FIR filter impulse response coefficient, and configured to convert, synchronous with one of $f_{EXC}$ and $2 \times f_{EXC}$, the latched digital data into the $I_{COMP}$ compensation current, such that (iv) transitions of the $I_{COMP}$ compensation current are synchronized with fluxgate core saturation cycles. Such embodiments can include embodiments in which the forward path does not operate with A/D conversion using oversampling, but includes an analog integration function before, or a digital integration function after, A/D conversion. For example, such embodiments can be implemented with an MDC forward path that is coupled to receive an analog sense signal output of the fluxgate sense coil induced by a sense field in the fluxgate core that corresponds to a difference between the external field $B_{EXT}$, and a compensation field $B_{COMP}$, and configured to provide MDC loop digital data as the sensor data representative of the external $B_{EXT}$ field, and can include (a) ADC (analog-to-digital conversion) circuitry, using a sampling frequency $f_S$, and configured to convert one of the analog sense signal, and an integrated analog sense signal, to corresponding digital ADC data, and (b) a forward path integration function, synchronized with $f_S$, comprising one of (i) analog integration circuitry coupled to an input of the ADC circuitry, and configured to integrate the analog sense signal to provide the integrated analog sense signal, such that the ADC data corresponds to the MDC loop output digital data, and (ii) digital loop filter circuitry coupled to an output of the ADC circuitry and configured to integrate the ADC data, and provide the MDC loop output digital data.

FIG. 1A illustrates an example functional embodiment of a fluxgate sensor 100 according to the invention, adapted to measure an external magnetic field $B_{EXT}$ (with a bandwidth $f_B$) that magnetically couples into the fluxgate sensor. The fluxgate sensor 100 includes a fluxgate magnetics element 110, and a magnetic-to-digital converter (MDC) 120 that establishes an MDC control loop around the fluxgate magnetics element.

Fluxgate magnetics element 110 includes a magnetic core 111 with excitation, sense and compensation coils 112, 113, 114: (a) excitation coil 112 is used to drive the fluxgate core through alternating saturation cycles (B-H loop) with an excitation frequency $f_{EXC}$; (b) sense coil 113 responds to a sense field $B_{SENSE}$ within the fluxgate core; and (c) compensation coil 114 is used induce into the core a field-nulling compensation field $B_{COMP}$. Excitation frequency $f_{EXC}$ is a design parameter for the fluxgate magnetics element.

A field imbalance in the fluxgate core between the $B_{COMP}$ field and $B_{EXT}$ field, causes a $B_{SENSE}$ field that induces in the sense coil 113 a corresponding analog sense/error signal $V_{SENSE}$ (voltage pulses). That is, the sense field $B_{SENSE}$ corresponds to a difference (error) between an external field $B_{EXT}$ magnetically coupled into the fluxgate core 111, and the compensating $B_{COMP}$ field that is induced in the fluxgate core by operation of the MDC control loop.

Drive electronics 115 includes a drive circuit 116 that drives the excitation coil 113 with an excitation current $I_{EXC}$ at the excitation frequency $f_{EXC}$ to saturate the fluxgate core 111. A clock generator 117 provides a clock signal at a frequency $2 \times f_{EXC}$, divided down (118) to the excitation frequency $f_{EXC}$. The $2 \times f_{EXC}$ clock is used to demodulate (rectify) the $V_{SENSE}$ error signal to $V_{RECTIFIED}$.

The MDC control loop includes a forward data conversion path 130, and a feedback compensation path 140. The MDC forward path 130 is coupled to the fluxgate sense coil 113, and operates to convert the analog $V_{SENSE}$ (rectified) error signal to digital sensor data as the output of the MDC control loop. The MDC feedback compensation path 140 couples back to the fluxgate compensation coil 114, generating in response to the MDC forward path (loop) output, an analog $I_{COMP}$ compensation current injected into the fluxgate compensation coil to close the MDC control loop.

That is, by operation of the MDC control loop, in response to the $V_{SENSE}$ error signal from the fluxgate sense coil, corresponding to a $B_{SENSE}$ field in the fluxgate core, compensation current $I_{COMP}$ is injected into the fluxgate compensation coil to induce a compensation field $B_{COMP}$ that nulls the $B_{EXT}$ field coupled into the fluxgate core. The resulting output of the MDC control loop provides sensor response data (sensor response information) that can be used in measuring (or otherwise sensing) the $B_{EXT}$ field.

MDC forward path 130 includes A/D conversion 131 that uses oversampling, and digital loop filtering 133. Anti-aliasing filtering 132 band limits the rectified input $V_{SENSE}$ signal, enabling the use of reasonable oversampling frequencies that are larger than the fluxgate excitation frequency. Gain can be introduced by 132 to reduce input referred quantization noise of A/D converter 131.

The oversampling frequency $f_S$ used for A/D conversion is greater than the bandwidth Nyquist rate for the bandwidth $f_B$ of the target external field $B_{EXT}$, and commonly will be substantially greater. The oversampling frequency $f_S$ is a design parameter related to the bandwidth $f_B$ of the $B_{EXT}$ field to be measured (input), and to a specified resolution for the sensor response data (output) of the fluxgate sensor (including the fluxgate magnetics element). For example, $f_S$ can by design be specified as an integer multiple of the excitation frequency $f_{EXC}$. As an illustrative design case, a fluxgate sensor can be configured to measure an external field $B_{EXT}$ with a bandwidth $f_B$=100 kHz, using fluxgate magnetics operated at an excitation frequency of $f_{EXC}$=1 MHz, and an MDC operated with an oversampling frequency of $f_S$=10 MHz ($f_S$=10×$f_{EXC}$).

For purposes of this Disclosure, including the description of example embodiments and the interpretation of the Claims, certain operations are, in the MDC forward path 130, indicated as being synchronized with $f_S$ as used for A/D conversion, and, in MDC feedback path 140, indicated as being synchronized with $f_{FB}$, where $f_{FB}$=(M/N)×$f_S$ (M and N are integers), i.e. $f_{FB}$ is described as a function of $f_S$. For example, (a) in the MDC forward path, digital loop filtering is describe as synchronous with $f_S$, and (b) in the MDC feedback path, D/A conversion is described as synchronous with $f_{FB}$. Clocking these forward and feedback path operations is a design choice that depends upon the design selection of the sampling frequency $f_S$ in relation to a specified data rate $f_{DR}$ (related to the bandwidth $f_B$ of $B_{EXT}$) for the output sensor data $SD_{OUT}$, and other system design considerations, such as the fluxgate excitation frequency $f_{EXC}$. Describing an operation as synchronized or synchronous with $f_S$ or $f_{FB}$ does not indicate a design requirement that the operation is clocked at precisely $f_S$ or $f_{FB}$. Rather, by design selection, operations in the forward path can be clocked at frequencies that are integer multiples of $f_S$, and operations in the feedback path can be clocked at frequencies that are functions of $f_S$ according to $f_{FB}$=(M/N)×$f_S$.

As an example design illustration, MDC implementations can be designed for use with a fluxgate magnetics element with an excitation frequency $f_{EXC}$ of 1 MHz, and with a forward path oversampling frequency $f_S$=10 MHz (where the A/D conversion operation uses oversampling), and a feedback path frequency $f_{FB}$=20 MHz. Other example implementations include synchronizing forward and feedback paths to the same $f_S$ sampling clock, and synchronizing the feedback path to $f_{FB}$=0.5$f_S$, using a 5 MHz clock phase locked to a 10 MHz oversampling clock $f_S$.

For the example functional embodiment illustrated in FIG. 1A in which the A/D conversion uses oversampling, digital loop filtering 133 is synchronized with the forward path oversampling frequency $f_S$, and determines loop gain and loop noise bandwidth. In addition, digital loop filtering provides the forward path integration function.

The digital output of the loop filter 133 provides the forward path sensor data output $SD_{OUT}$ of the MDC 120, and provides the input to the MDC feedback path 140. The loop output $SD_{OUT}$ is commonly down sampled to a data rate $f_{DR}$ corresponding to the Nyquist rate 2×$f_B$ for the bandwidth of the target $B_{EXT}$ field (see the description in connection with FIGS. 4 and 5).

If forward path A/D conversion uses oversampling, and the oversampling frequency $f_S$ is by design choice an integer multiple of the excitation frequency $f_{EXC}$, then notch filtering can be used to suppress $f_{EXC}$ and its even harmonics. In addition, if chopping is used for dynamic offset cancellation in the forward path, then notch filtering can be used to remove chopping artifacts.

Figure 1B:
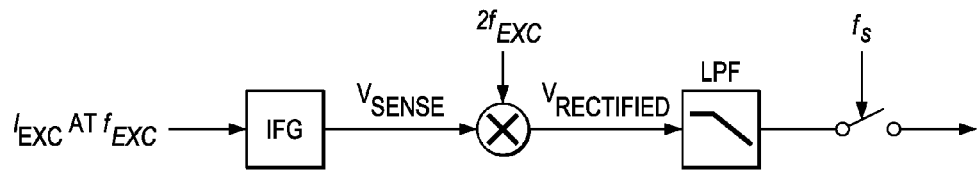
FIGS. 1B, 1C, 1D illustrate, for the example embodiment in FIG. 1A, an anti-aliasing function that band-limits (low pass filters) the fluxgate sense coil output (demodulated) prior to oversampling A/D conversion.
Figure 1C:
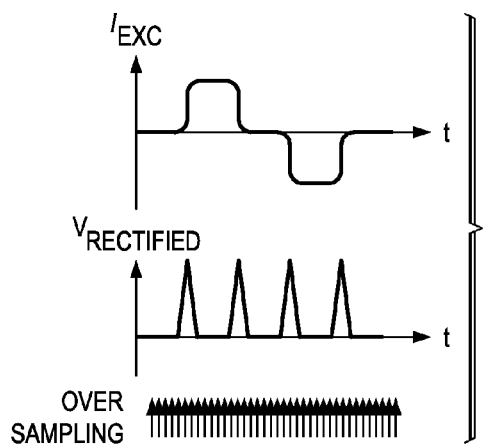
Figure 1D:
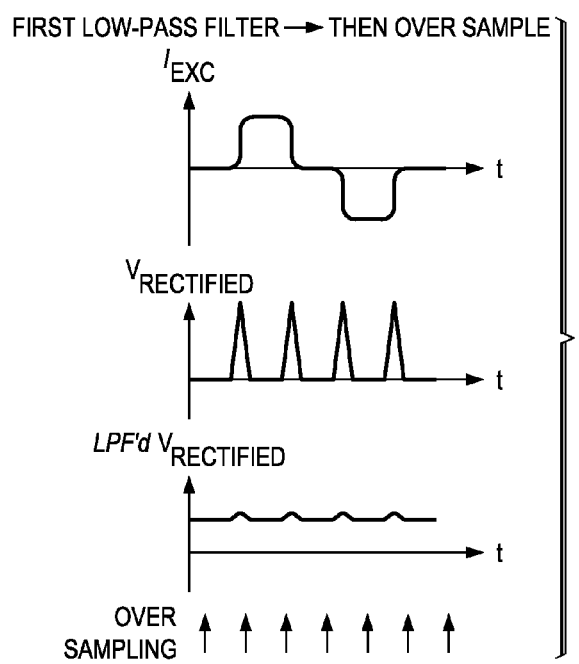

FIGS. 1B, 1C, 1D illustrate, for the example embodiment in FIG. 1A, the anti-aliasing function that band-limits (low pass filters) the demodulated $V_{SENSE}$ error signal prior to oversampling A/D conversion. Note that the sensor response information from the fluxgate sensor is embedded in the average of demodulated $V_{SENSE}$ signal ($V_{RECTIFIED}$), i.e., in the baseband of the $V_{RECTIFIED}$ pulses. Anti-aliasing band-limits the $V_{RECTIFIED}$ signal with an analog low pass filter, relaxing the OSR (oversampling ratio) requirement for $f_S$, which is advantageous for wide-band applications. In an example embodiment of a fluxgate sensor described below in connection with FIG. 4, the MDC forward path implements a continuous time sigma delta oversampling modulator where the continuous-time loop filter of the modulator behaves as a band-limiting anti-aliasing filter.

Referring to FIG. 1A, MDC feedback compensation path 140 includes D/A conversion 141 synchronized with $f_{FB}$ ((M/N)×$f_S$). The MDC feedback path converts feedback loop-filtered digital data from the MDC forward path (digital loop filter 133), to compensation current $I_{COMP}$ which is injected into the fluxgate compensation coil 114 to induce in the fluxgate core 111 the compensation field $B_{COMP}$. The MDC control loop controls $I_{COMP}$, and thereby controls $B_{COMP}$ to null the external $B_{EXT}$ field.

The MDC feedback compensation path 140 can include a sample-and-hold function 149 clocked by $f_{EXC}$ (or 2×$f_{EXC}$), to synchronize the $I_{COMP}$ compensation current with fluxgate core saturation cycles, so that $I_{COMP}$ transitions occur when fluxgate compensation coil inductance is at a minimum. Because the fluxgate magnetics element is not an integrating element, an instantaneous compensation current effect at transitions of fluxgate core excitation is reflected in the forward/sense path. Switching the $I_{COMP}$ transitions into the fluxgate compensation coil in synchronization with fluxgate core saturation cycles is advantageous because coil inductance is reduced by orders of magnitude when the magnetic core is saturated. Moreover, such operation relaxes jitter performance requirements on the MDC feedback path.

An example embodiment of the feedback path DAC functionality is described below in connection with FIG. 9A, in which this $I_{COMP}$ synchronization function is implemented as digital sample-and-hold functionality integrated into a FIR DAC.

Figure 2:
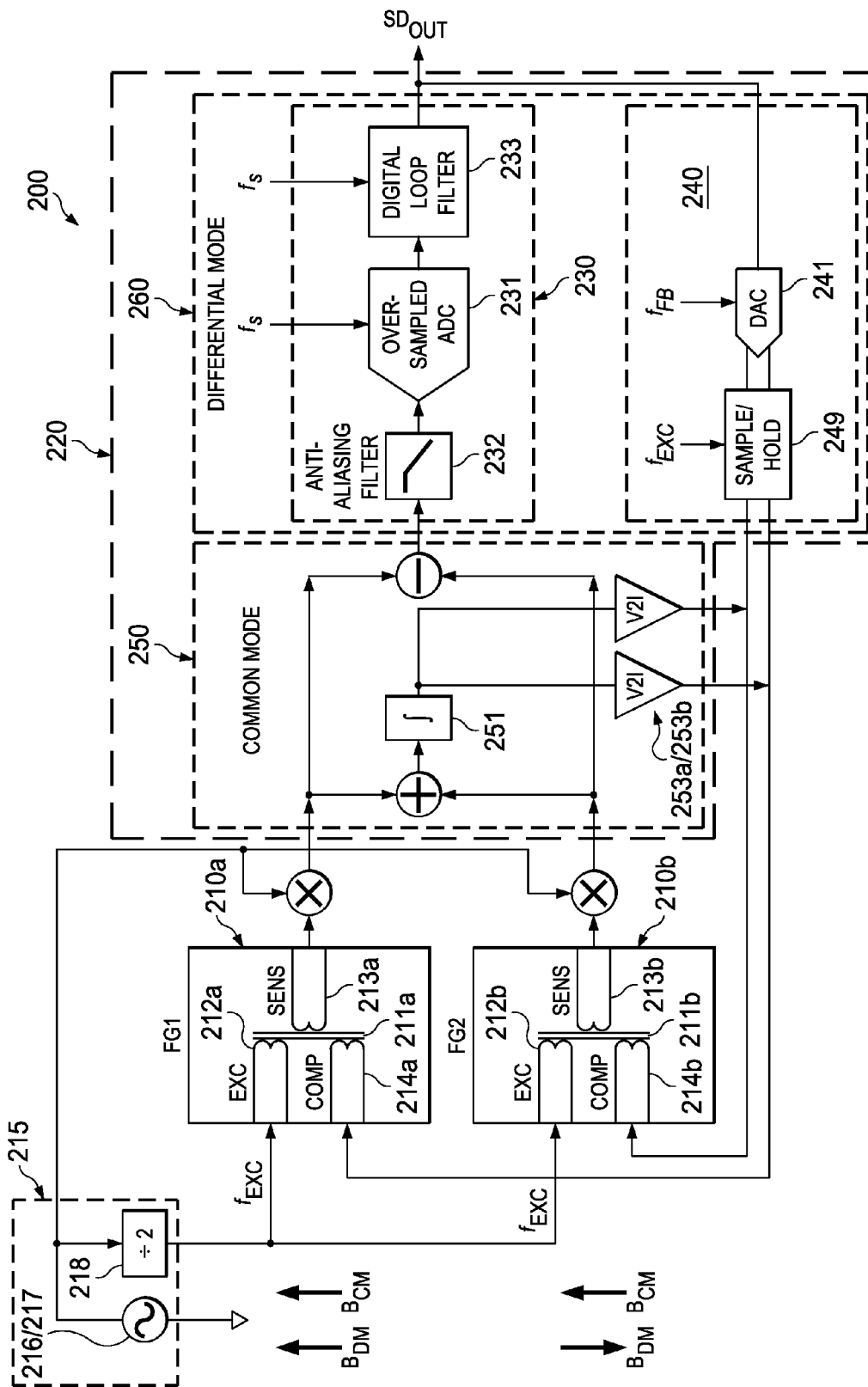
FIG. 2 illustrates an example functional embodiment of a fluxgate sensor in a differential topology with dual fluxgate magnetics elements, and including magnetic-to-digital conversion (MDC) with (a) a common-mode field compensation loop configured to null (suppress) stray fields that appear in common mode ($B_{CM}$), and (b) a differential-mode control loop functionally equivalent to the MDC control loop illustrated in FIG. 1A, operating on differential mode components $B_{DM}$ of the target $B_{EXT}$ field, and providing corresponding sensor data output $SD_{OUT}$.

FIG. 2 illustrates an example functional embodiment of a fluxgate sensor 200 in a differential topology, adapted to measure a differential field $B_{EXT}$ that includes a differential component $B_{DM}$ to be measured and a stray field common-mode component $B_{CM}$ to be rejected. A magnetics-to-digital converter 220 implements common-mode and differential-mode loops 250 and 260 that effectively null both the common-mode component $B_{CM}$ and differential-mode components $B_{DM}$ of the external magnetic field $B_{EXT}$ coupled into the fluxgate cores.

Fluxgate sensor 200 includes dual fluxgate magnetics elements 210a/210b, with respective magnetic cores 211a/b and respective excitation, sense and compensation coils 212a/b, 213a/b, 214a/b. The fluxgate magnetics elements are respectively disposed and oriented relative to an external field source such that the $B_{EXT}$ field magnetically coupled into respective fluxgate cores appears as respective differential-mode components $B_{DM}$.

Drive electronics 215 drives the excitation coils 213a/b with excitation current $I_{EXC}$ at an excitation frequency $f_{EXC}$ to saturate the fluxgate cores 211a/b. Drive electronics 215 also supplies a 2×$f_{EXC}$ clock used to demodulate (rectify) the $V_{SENSE}$ error signals.

MDC 220 performs analog common-mode field compensation 250, and implements a differential-mode digital control loop 260 that corresponds to the MDC control loop (120) functionally described in connection with FIG. 1A.

The MDC common-mode field compensation loop 250 receives respective $V_{SENSE}$ error signals from the fluxgate sense coils 213a/b, which correspond to respective sense fields that include the common-mode $B_{CM}$ and differential-mode $B_{DM}$ field components. The average sum of the two $V_{SENSE}$ error signals produced by 251 drives V2I converters 253a/b that generate respective common-mode compensation currents $I_{COMP,CM}$. The common-mode compensation currents are injected into respective compensation coils 214a/b to induce common-mode compensation fields $B_{COMP,CM}$ into the fluxgate cores 211a/b. These common-mode compensation fields null the common-mode field component $B_{CM}$ of the external field $B_{EXT}$ that appears in both fluxgate cores 211a/b.

The MDC differential-mode control loop 260 functions in differential mode in a manner equivalent to the MDC control loop described in connection with FIG. 1A (MDC 120). The MDC differential-mode control loop 260 includes a forward path 230, and a feedback compensation path 240.

The differential-mode forward path 230 receives differential $V_{SENSE}$ error signals from respective fluxgate sense coils 213a/b. The $V_{SENSE}$ error signals are induced by sense fields in respective fluxgate cores 211a/b. Each sense field corresponds to a difference between (a) the total external fields, i.e., the differential component $B_{DM}$ and common-mode component $B_{CM}$ of $B_{EXT}$, and (b) the total compensation fields, i.e., the differential component $B_{COMP,DM}$ of the compensation field induced by operation of the differential-mode loop 260, and the common-mode compensation field $B_{COMP,CM}$ induced by operation of common-mode loop 250. In processing the differential $V_{SENSE}$ error signals, the differential-mode loop 260 automatically rejects error signals produced by the sense coils that are associated with the common-mode external and compensation fields, and hence only processes the $V_{SENSE}$ error signals associated with the differential fields ($B_{DM}$ component of $B_{EXT}$ and $B_{COMP,DM}$).

Digital loop filtering 233 is synchronized with the forward path oversampling frequency $f_S$, and determines loop gain and loop noise bandwidth. The digital output of the loop filter 233 provides the forward path sensor data output $SD_{OUT}$ of the MDC 220, and provides the input to the MDC feedback path 240. The loop output $SD_{OUT}$ is commonly down sampled to a data rate $f_{DR}$ corresponding to the Nyquist rate 2×$f_B$ for the bandwidth of the target $B_{EXT}$ field (see the description in connection with FIGS. 4 and 5).

The MDC feedback compensation path 240 includes D/A conversion 241 synchronized with $f_{FB}$ ((M/N)×$f_S$). The MDC feedback path receives loop-filtered digital data from the MDC forward path (digital loop filter 233), and functions to generate respective differential-mode compensation currents $I_{COMP,DM}$ that are injected into respective compensation coils 214a/b. The MDC differential control loop 260 controls the $I_{COMP,DM}$ compensation currents to induce in the fluxgate cores 211a/b respective compensation fields $B_{COMP,DM}$ to null the differential components $B_{DM}$ of the external field $B_{EXT}$.

The MDC feedback path can include sample-and-hold functionality 241 clocked by $f_{EXC}$ (or 2×$f_{EXC}$), to synchronize the $I_{COMP}$ compensation currents with fluxgate core saturation cycles, so that $I_{COMP}$ transitions occur when fluxgate compensation coil inductance and the linkage between the coils is at a minimum.

Figure 3B:
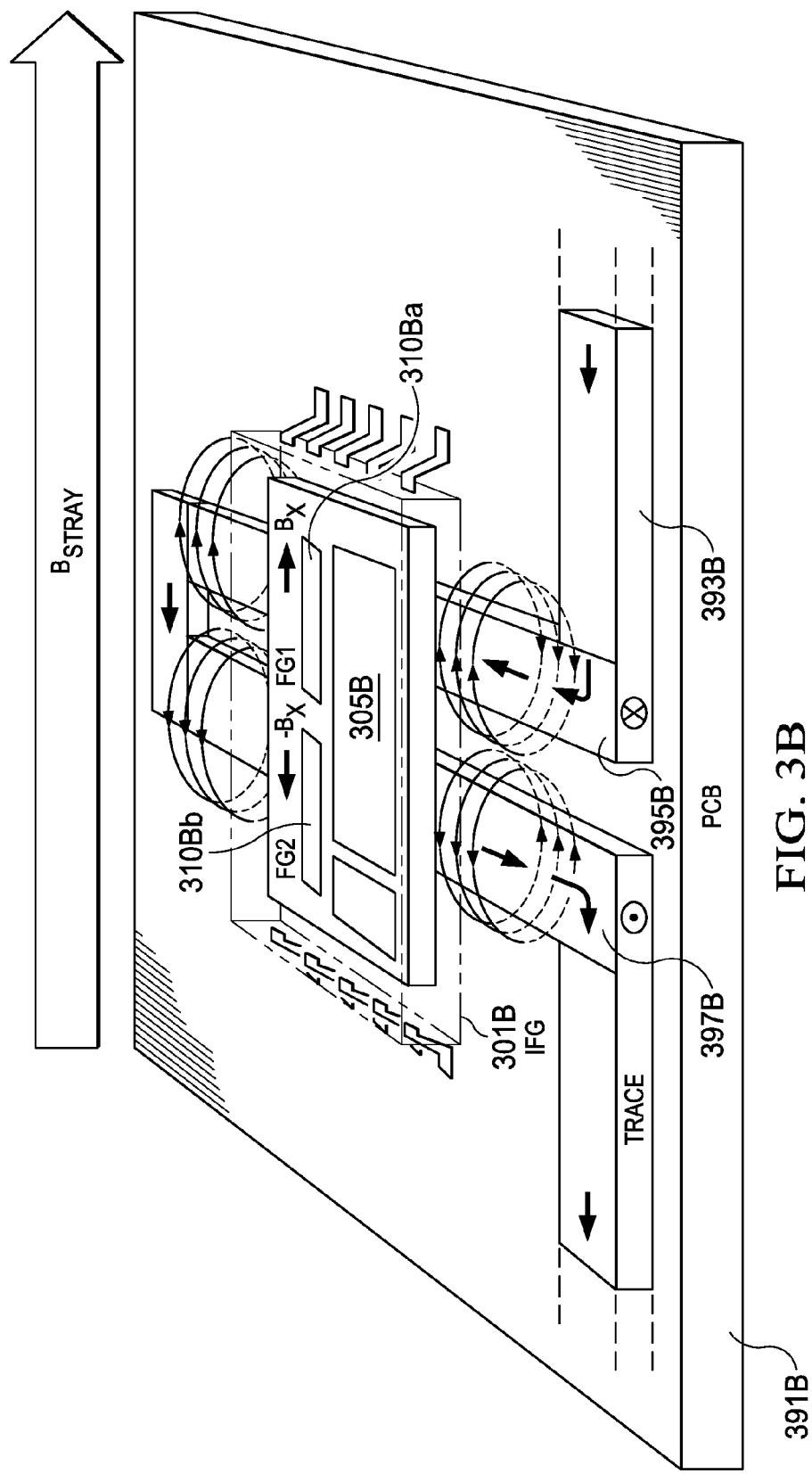
Figure 3C:
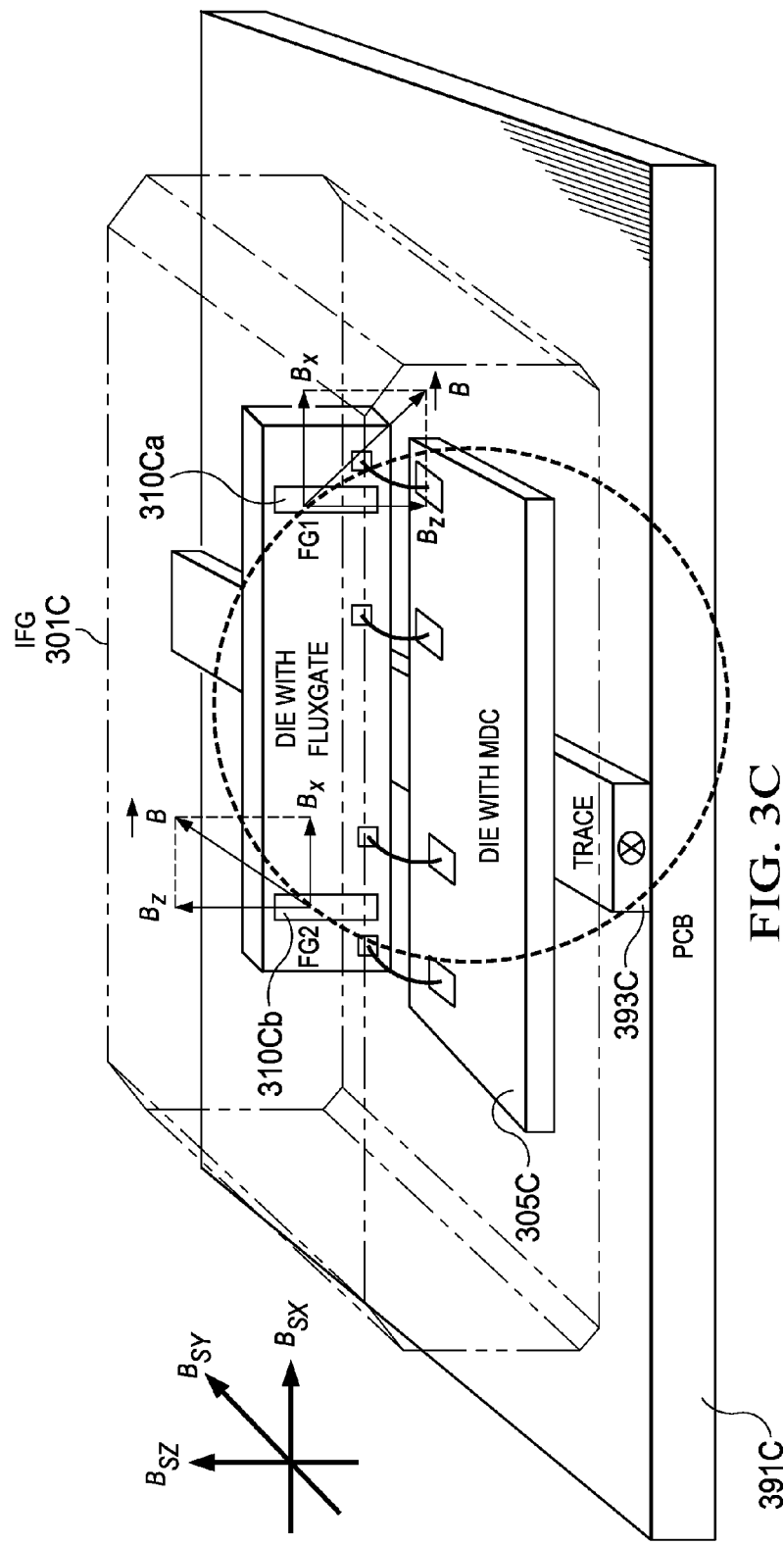

FIGS. 3A, 3B, 3C illustrate an example application of an integrated (packaged) fluxgate sensor (IFG), including MDC electronics according to the invention, adapted for contactless current sensing. Referring to FIG. 3A, an IFG 301A is placed over a PCB (printed circuit board) trace 393A, with a fluxgate magnetic sense element 310A disposed adjacent to the PCB trace. Current flow through the PCB trace 393A creates an external field $B_X$ that magnetically couples into the fluxgate magnetics element 310A.

FIGS. 3B and 3C illustrate IFG sensors with differential topologies configured for differential current measurement, including suppression of common mode stray fields (such as the Earth's magnetic field). As an example illustration, differential-mode current-induced magnetic fields can be on the order of 1.5 mT, compared to a common-mode stray field of 200 uT.

FIG. 3B illustrates an IFG 301B with dual fluxgate magnetics elements 310Ba/b (single die xy-planer package) configured for x-axis sensitivity. IFG 301B is placed over a PCB U-trace 393B that includes separate parallel traces 395B and 397B, with fluxgate magnetics elements 310Ba/b disposed over respective parallel traces 395B/397B.

FIG. 3C illustrates an IFG 301C with dual fluxgate magnetics elements 310Ca/b (orthogonal-die, z-axis package) configured for z-axis sensitivity to anti-phase $B_Z$ fields. IFG 301C includes a z-axis fluxgate magnetics die 303C orthogonal to an xy-coplanar MDC electronics die 305C. The z-axis fluxgate magnetics die 303C includes dual fluxgate magnetics elements 310Ca/b. IFG 301C IFG can be placed over a single PCB trace that produces the anti-phase $B_Z$ fields. The stray fields $B_{SX}$ and $B_{SY}$ are not detected by the IFG sensor, and $B_{SZ}$ is common mode.

Figure 4A:
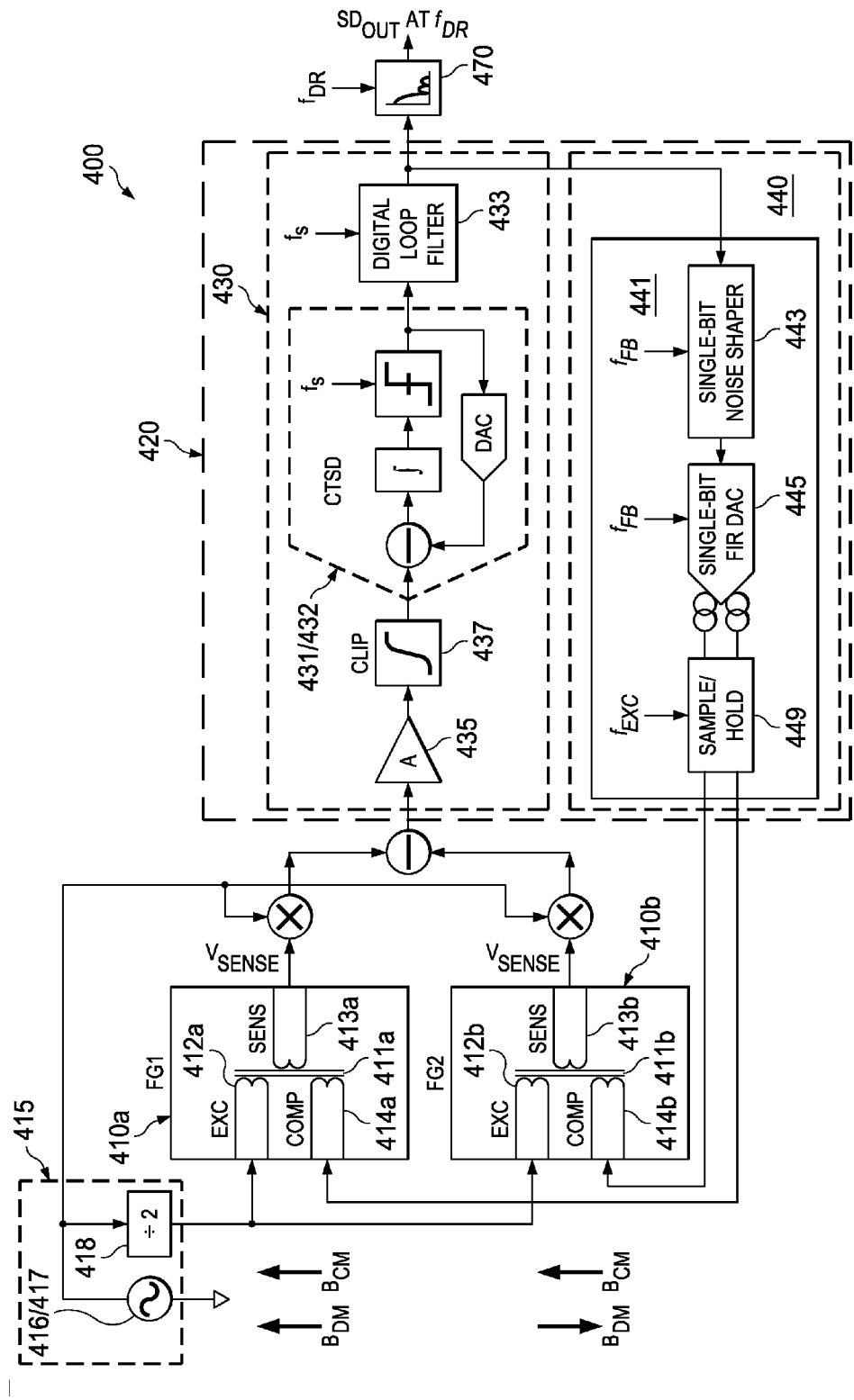
FIG. 4A illustrates an example embodiment of a fluxgate sensor in a differential topology with dual fluxgate magnetics elements, including a magnetic-to-digital converter (MDC) with a differential MDC_DM control loop, including (a) a forward path including an oversampling ($f_S$) continuous time sigma delta (CTSD) modulator, and (b) a feedback compensation path synchronized with $f_{FB}$ ($(M/N) \times f_S$), and including D/A conversion implemented with a noise shaper and FIR DAC, and including sample/hold functionality that synchronizes $I_{COMP}$ transitions to fluxgate core saturation cycles ($f_{EXC}$ or $2 \times f_{EXC}$).

FIG. 4A illustrates an example embodiment of a fluxgate sensor 400 in a differential topology. To focus the description of this embodiment on the MDC control loop, FIG. 4A does not illustrate the common mode compensation loop, such as described in connection with FIG. 2.

Fluxgate sensor 400 can include dual fluxgate magnetics elements 410a/410b, with respective magnetic cores 411a/b and respective excitation, sense and compensation coils 412a/b, 413a/b, 414a/b. Drive electronics 415 drives the excitation coils 413a/b with excitation current $I_{EXC}$ at an excitation frequency $f_{EXC}$ to saturate the fluxgate cores 411a/b (B-H loop), and supplies a $2 \times f_{EXC}$ clock used to demodulate (rectify) $V_{SENSE}$ error signals from the sense coils 413a/b, so that, as used in this description, $V_{SENSE}$ designates a rectified signal.

A magnetic-to-digital converter (MDC) 420 includes a forward data conversion path 430, and a feedback compensation path 440. In the forward path 430, the oversampling ADC function is implemented as a continuous-time sigma delta (CTSD) modulator 431/432 with an oversampling clock $f_S$. In the feedback path 440, the DAC function 441 is implemented with a noise shaper 443 and a FIR DAC 445, both synchronized with $f_{FB}=(M/N) \times f_S$, where the selection of $f_{FB}$ relative to the oversampling clock $f_S$ is a design choice.

In the forward path 430, the CTSD modulator includes a continuous-time loop filter that behaves as a band-limiting anti-aliasing filter. The oversampling frequency $f_S$ that clocks the CTSD is greater than the bandwidth $f_B$ of the target external field $B_{EXT}$, and can by design be specified as an integer multiple (one or greater) of the excitation frequency $f_{EXC}$. Amplification 435 and clipping 437 can be used to condition the $V_{SENSE}$ error signal prior to oversampling and data conversion by the CTSD, including reducing input referred quantization noise.

A digital loop filter 433, synchronized with the oversampling frequency $f_S$, establishing loop gain and loop noise bandwidth, i.e., for this example embodiment in which the A/D conversion uses oversampling, digital loop filtering 133 is synchronized with the forward path oversampling frequency $f_S$. In addition, digital loop filtering provides the forward path integration function.

Digital loop filter 433 provides the MDC loop output digital data corresponding to the sensor response data for the fluxgate sensor 400, and input to the MDC feedback compensation path.

The loop output from the loop filter 433, clocked at $f_S$, is provided to an output filter 470 clocked at an output data rate $f_{DR}$. Output filter 470 (such as a sinc filter) down-samples the loop output to generate the sensor response data $SD_{OUT}$ (at $f_{DR}$) provided as the output of the MDC 430 (fluxgate sensor 400) after down-sampling. The $f_{DR}$ output (down-sampling) data rate corresponds to the Nyquist rate $2 \times f_B$ for the bandwidth of the target $B_{EXT}$ field. By comparison, in FIGS. 1A and 2, $SD_{OUT}$ is functionally illustrated as the MDC loop output from the digital loop filters (133, 233), i.e., without illustrating data output down-sampling to $f_{DR}$.

As noted, if forward path A/D conversion uses oversampling, and the oversampling frequency $f_S$ is by design choice an integer multiple of the excitation frequency $f_{EXC}$, then notch filtering can be used to suppress $f_{EXC}$ and its even harmonics. In addition, if chopping is used for dynamic offset cancellation in the forward path (see, for example, the description in connection with FIG. 5), notch filtering can be used to remove chopping artifacts.

Implementing the forward path oversampling ADC function with a CTSD has a number of advantages. Included in the MDC control loop, the CTSD operates as a forward path zero detector, with inherent anti-aliasing and reduced OSR. The CTSD is a fully electrical-domain CTSD, hence decoupling its design criteria from the fluxgate sensor sensitivities and operation, and relaxing its performance requirements. Moreover, the CTSD resolution requirements can be relaxed if gain is provided by the anti-aliasing loop filter, reducing total input referred quantization noise. As an example the CTSD can be implemented with a second-order multi-bit design without the requirement for DEM (dynamic element matching) or DWA (data weighted averaging).

In the feedback path 440, the loop output of the digital loop filter 433 is input to the noise shaper 443, which noise-shapes the loop output for input to the FIR DAC 445. The FIR DAC is fully balanced, and provides differential $I_{COMP}$ compensation currents, that can be injected into respective fluxgate compensation coils 414a/b. The FIR filter order is preferably equal to or greater than the order of the noise-shaper.

As with the digital loop filter 433 in the forward path, the FIR filter in the feedback path can be configured for notch filtering if the forward path oversampling frequency $f_S$ is by design choice an integer multiple of the excitation frequency $f_{EXC}$, with filter notches at $f_{EXC}$ and its even harmonics.

Feedback path 440 can include sample-and-hold functionality 449, clocked by $f_{EXC}$ (or $2 \times f_{EXC}$), to synchronize the $I_{COMP}$ compensation current with fluxgate core saturation cycles, so that $I_{COMP}$ transitions occur when fluxgate compensation coil inductance is at a minimum. If the notches of the FIR DAC are tuned to $f_{EXC}$ and its harmonics, noise folding through the sample-and-hold function can be avoided. FIG. 9A, described below, illustrates an example implementation of a FIR DAC that integrates digital sample-and-hold functionality.

Alternatively, the DAC functionality 441 in the feedback compensation path 440 can be implemented with a sigma-delta (or other oversampling) DAC and a reconstruction filter. The reconstruction filter can be synchronized to $f_{EXC}$ (or $2 \times f_{EXC}$) and configured to filter the analog DAC output so that the $I_{COMP}$ compensation current transitions into the fluxgate compensation coil in synchronization with fluxgate core saturation cycles.

Single bit implementations for the noise shaper 443 and FIR DAC 445 have a number of advantages, including inherent linearity.

Figure 4B:
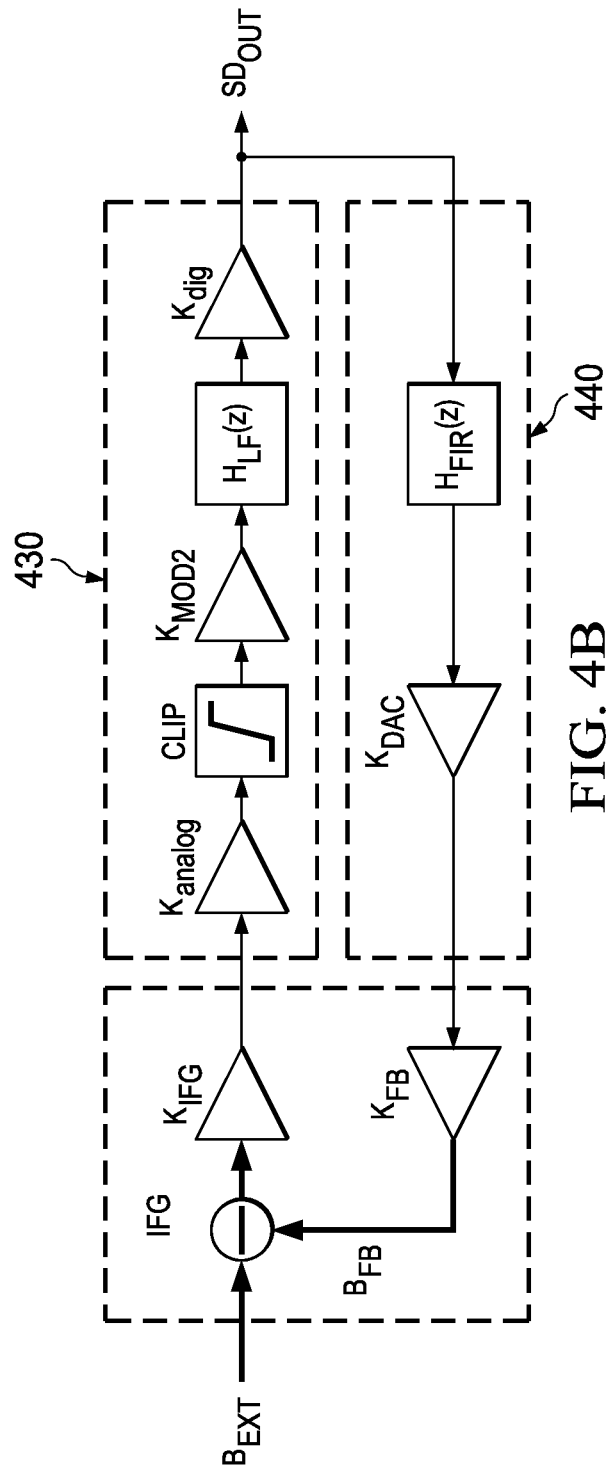
FIG. 4B illustrates a linear model for the example embodiment of a fluxgate sensor in FIG. 4A.

FIG. 4B illustrates a linear model for the example embodiment of a fluxgate sensor in FIG. 4A, confirming loop stability for normal operation. As a design example: (a)

assume $f_{EXC}$, $2 \times f_{EXC}$, $f_S$, and CTSD signal transfer function bandwidth is greater than 10× the loop bandwidth, and (b) neglect zero-order hold functions. Then, for a design example $$K_{IFG} = 100[V/T] \propto N_{sense} \cdot f_{EXC} \cdot I_{EXC} \cdot \mu_{eff} \cdot area$$

$$K_{FB} = 0.08[T/A] \propto \mu_{eff} \cdot N_{comp}/L_{core}$$

$$K_{analog} = 32; K_{dig} = 256; K_{MOD2} = 1/V_{REF}, V_{REF} = 2V$$

$$Clip@1.5 \cdot V_{REF}; K_{DAC} = 2 \cdot I_{FSDAC}/2^{NDAC}$$

$N_{sense}$=Number of fluxgate sense coil windings; $I_{EXC}$=value of excitation current; Ueff=effective magnetic permeability; $N_{comp}$=number of fluxgate compensation coil windings; Lcore=Length of magnetic core; $V_{REF}$=ADC reference voltage; Kanalog=analog gain; Kdig=digital gain; $K_{MOD2}$=modulator transfer rate; Kdac=DAC transfer rate; $I_{FSDAC}$=full scale DAC output current.

Figure 5:
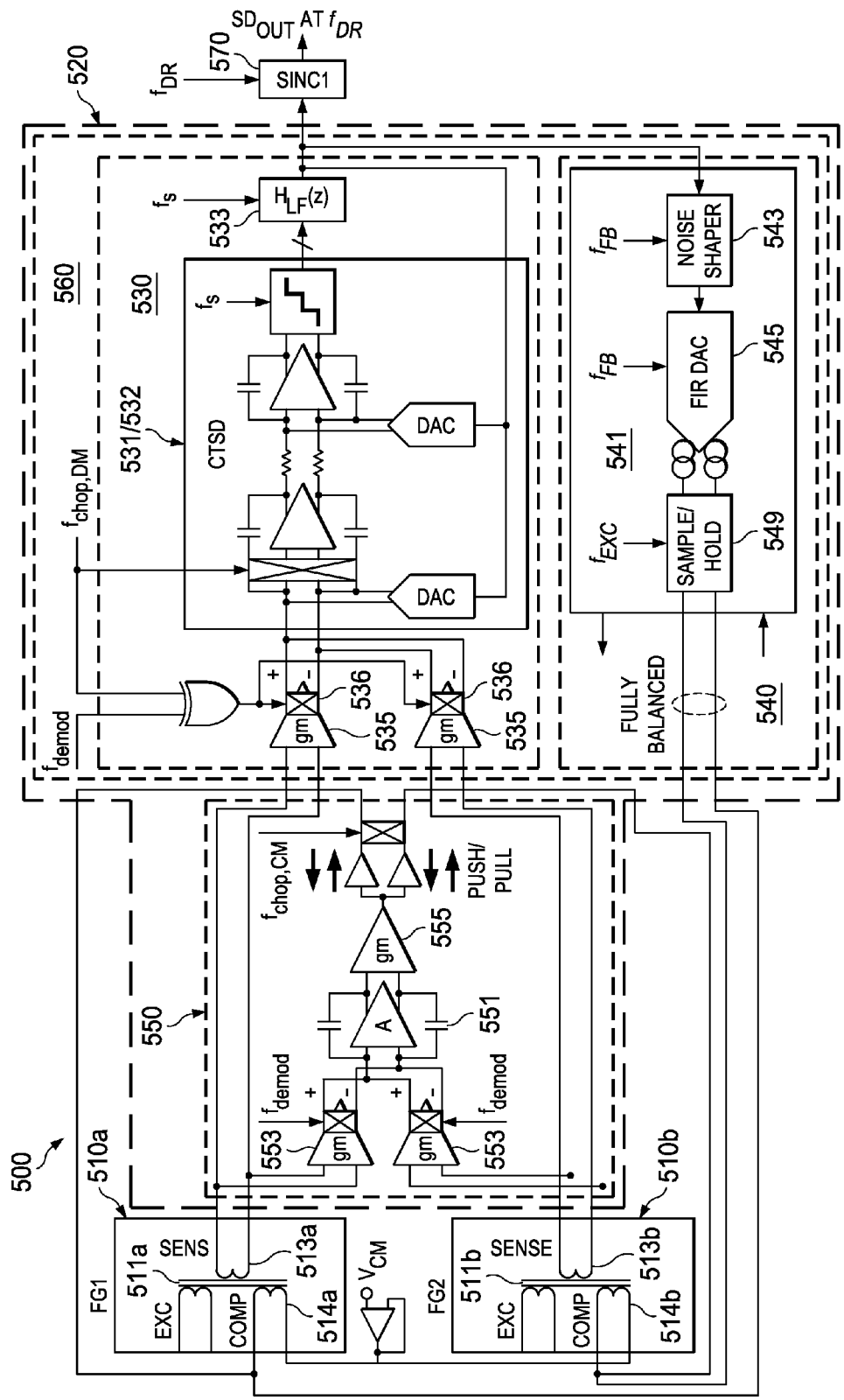
FIG. 5 illustrates an example embodiment of a fluxgate sensor adapted to a differential topology with dual fluxgate magnetics elements, including a magnetic-to-digital converter (MDC), with (a) a common-mode field compensation loop that injects common-mode compensation currents into the fluxgate compensation coils to null (suppress) the common-mode field components, and (b) a differential MDC_DM control loop functionally equivalent to the MDC_DM control loop illustrated in FIG. 4A, including a forward path oversampling ($f_S$) CTSD, and a feedback compensation path synchronized with $f_{FB}$ ($(M/N) \times f_S$), including D/A conversion implemented with a noise shaper and FIR DAC, and including sample/hold functionality that synchronizes $I_{COMP}$ transitions to fluxgate core saturation cycles ($f_{EXC}$ or $2 \times f_{EXC}$).

FIG. 5 illustrates an example embodiment of a fluxgate sensor 500 in a differential topology, including a common-mode field compensation loop, as functionally illustrated in FIG. 2. The differential-mode fluxgate sensor 500 is adapted to measure the differential components $B_{DM}$ of an external field $B_{EXT}$, rejecting stray fields manifested in the fluxgate cores as a common-mode component $B_{CM}$.

Fluxgate sensor 500 includes dual fluxgate magnetics elements 510a/b, with respective magnetic cores 511a/b and respective excitation, sense and compensation coils 512a/b, 513a/b, 514a/b. The fluxgate magnetics elements 510a/b are respectively disposed and oriented such that the external field $B_{EXT}$ magnetically couples into the respectively fluxgate cores as differential-mode components $B_{DM}$.

Fluxgate sensor 500 includes an MDC including a common-mode field compensation loop 550, and a differential MDC control loop 560.

As functionally described in connection with FIG. 2, the analog common-mode loop 550 is configured to inject common-mode compensation currents into the fluxgate compensation coils 514a/b. Respective $V_{SENSE}$ error signals from the fluxgate sense coils 513a/b correspond to respective sense fields that include the common-mode $B_{CM}$ and differential-mode $B_{DM}$ field components. Gm amplifiers 553 convert the $V_{SENSE}$ signals to current signals, which are rectified, added, and integrated 551, and the resulting common-mode compensation currents are driven 555 back to respective compensation coils 514a/b, with chopping to reduce input offset. The chopper phase operating at $f_{chop,CM}$ can be synchronized to the saturation phase of the fluxgate magnetic core ($f_{EXC}$ or $2 \times f_{EXC}$), i.e. facilitating compensation current transitions into the fluxgate compensation coil. The common-mode compensation currents induce common-mode compensation fields into respective fluxgate cores 511a/b. These common-mode compensation fields null the common-mode component $B_{CM}$ of the external field $B_{EXT}$ that appears in both fluxgate cores 511a/b.

The MDC differential-mode loop 560 is implemented as described in connection with FIG. 4, including a forward data conversion path 530 implemented with an oversampling ($f_S$) continuous time sigma delta (CTSD) converter 531/532, and a feedback compensation path 540 implementing D/A conversion 541 with a noise shaper 543 and FIR DAC 545. Both the noise shaper 543 and FIR DAC 545 are synchronized with $f_{FB}=(M/N) \times f_S$, where the selection of $f_{FB}$ relative to the oversampling clock $f_S$ is a design choice.

In the forward path 530, $V_{SENSE}$ error signals from the fluxgate sense coils 513a/b are input to Gm amplifiers 535, ratioed relative to the CTSD feedback coefficient to introduce a predetermined gain preceding the CTSD, reducing input referred quantization noise. The Gm amplifiers 535 implement demodulation (rectification) 536. The output currents of the GM amplifiers are subtracted and fed to the first integrator of the CTSD. Chopping can be used to suppress residual offset.

The CTSD modulator 531/532 (illustrated here as second order), includes a continuous-time loop filter that behaves as a band-limiting anti-aliasing filter. The oversampling frequency $f_S$ that clocks the CTSD is greater that the bandwidth $f_B$ of the target external field $B_{EXT}$, and can by design choice be an integer multiple (one or greater) of the excitation frequency $f_{EXC}$.

A digital loop filter 533, synchronized with the oversampling frequency $f_S$, provides the loop output, and establishes loop gain and loop noise bandwidth. The loop output of the digital loop filter provides the sensor data output of the MDC control loop. This loop output is down sampled by an output filter 570, here illustrated as a first order sinc1 filter with an output data rate $f_{DR}$ corresponding to the Nyquist rate $2 \times f_B$ for the bandwidth of the target external field $B_{EXT}$. The 570 filter's frequency response can be designed to provide notches at the CTSD chopping frequency to suppress chopping artifacts in the sensor data output $SD_{OUT}$.

In the feedback path 540, the loop output of the digital loop filter 533 is input to the noise shaper 543, which noise-shapes the input to a FIR DAC 545. The FIR DAC provides fully-balanced differential $I_{COMP}$ compensation currents injected into respective fluxgate compensation coils 514a/b. As noted in connection with FIG. 4, single bit implementations for the noise shaper 443 and FIR DAC 445 have a number of advantages, including inherent linearity.

As with the digital loop filter 533 in the forward path, the FIR DAC can be configured for notch filtering if the forward path oversampling frequency $f_S$ is by design choice an integer multiple of the excitation frequency $f_{EXC}$, with filter notches at $f_{EXC}$ and its even harmonics, recognizing that the FIR DAC is synchronized with $f_{FB}=(M/N) \times f_S$ (i.e, a function of $f_S$) so that $f_{FB}$ is an integer multiple of $f_{EXC}$.

Feedback path 540 can include sample-and-hold functionality 549, clocked by $f_{EXC}$ (or $2 \times f_{EXC}$), to synchronize the differential mode $I_{COMP,DM}$ compensation currents with fluxgate core saturation cycles, so that $I_{COMP}$ transitions occur when fluxgate compensation coil inductance is at a minimum. If the notches of the FIR DAC are tuned to $f_{EXC}$ and its harmonics, noise folding through the sample-and-hold function can be avoided. FIG. 9A, described below, illustrates an example implementation of a FIR DAC that integrates digital sample-and-hold functionality.

Figure 6:
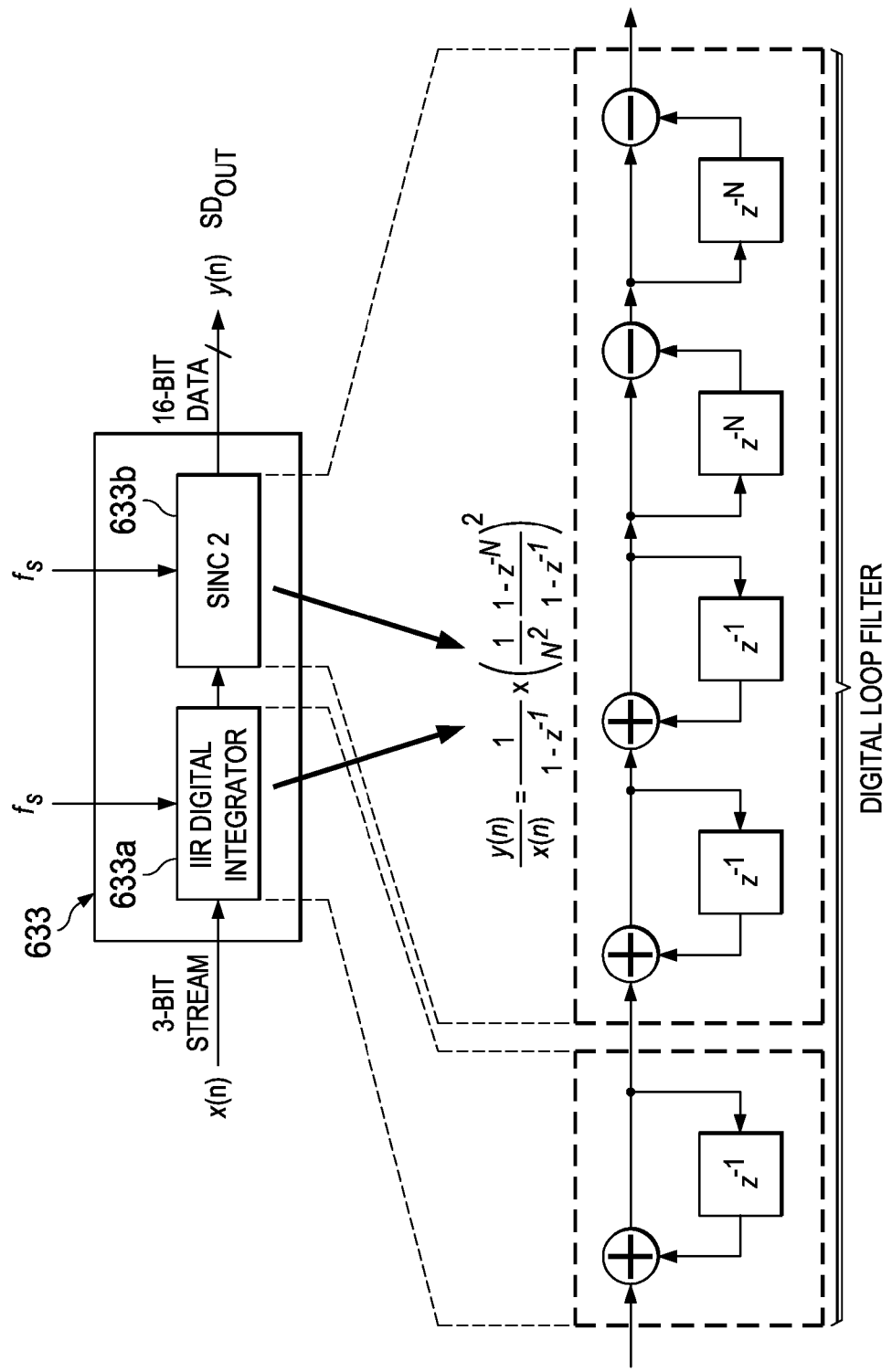
FIG. 6 illustrates an example implementation of a digital loop filter, such as can be used in the forward path of a magnetic-to-digital converter according to the invention.

FIG. 6 illustrates an example implementation of a digital loop filter 633, such as can be used in the forward path of a magnetic-to-digital converter according to the invention. The digital loop filter 633, synchronized with the oversampling frequency $f_S$ (or $M \times f_S$) is implemented with an IIR (infinite impulse response) digital integrating filter 633a and a second order sinc2 filter 633b. As noted, if the oversampling frequency is an integer multiple (one or more) of $f_{EXC}$, then notch filtering can be used to suppress frequency components of $f_{EXC}$ and its even harmonics.

Figure 7:
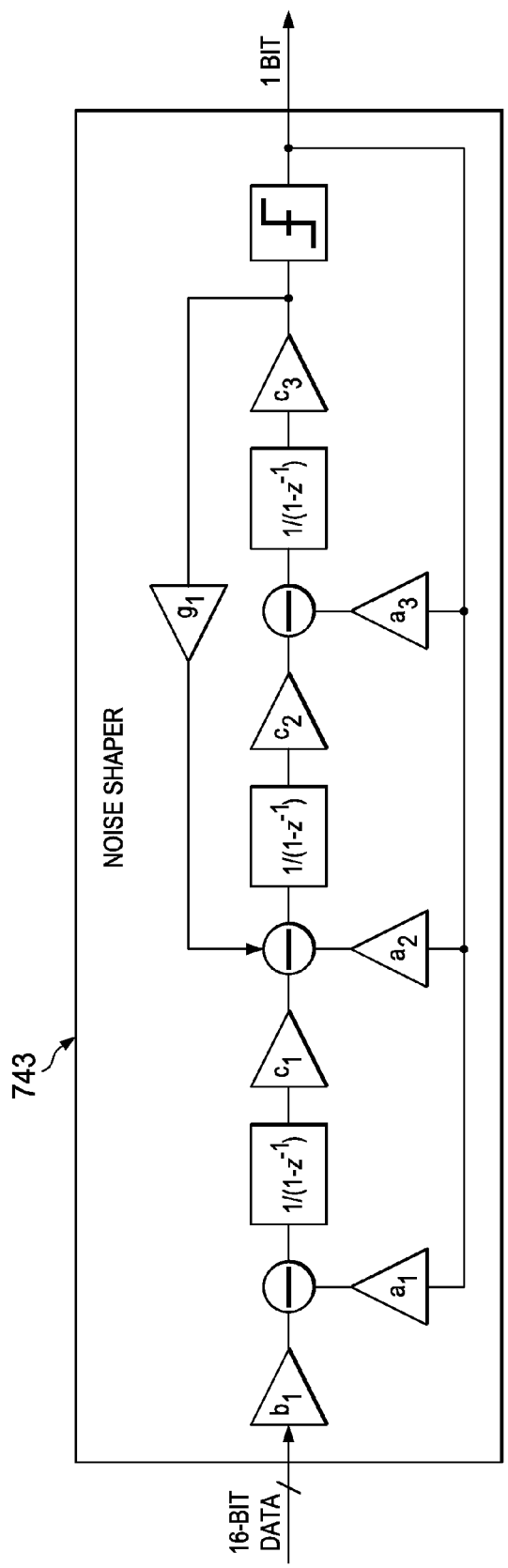
FIG. 7 illustrates an example implementation of a noise shaper, such as can be used in the feedback compensation path of a magnetic-to-digital converter according to the invention.

FIG. 7 illustrates an example implementation of a noise shaper 743, such as can be used in the feedback compensation path of a magnetic-to-digital converter according to the invention. Noise shaper 743 is synchronized with $f_{FB}=(M/N) \times f_S$, where the selection of $f_{FB}$ relative to the oversampling clock $f_S$ is a design choice. Noise shaper 743 provides a single bit output for input to a single bit FIR DAC. Noise shaper 743 is implemented as a third order sigma delta modulator.

Figure 8A:
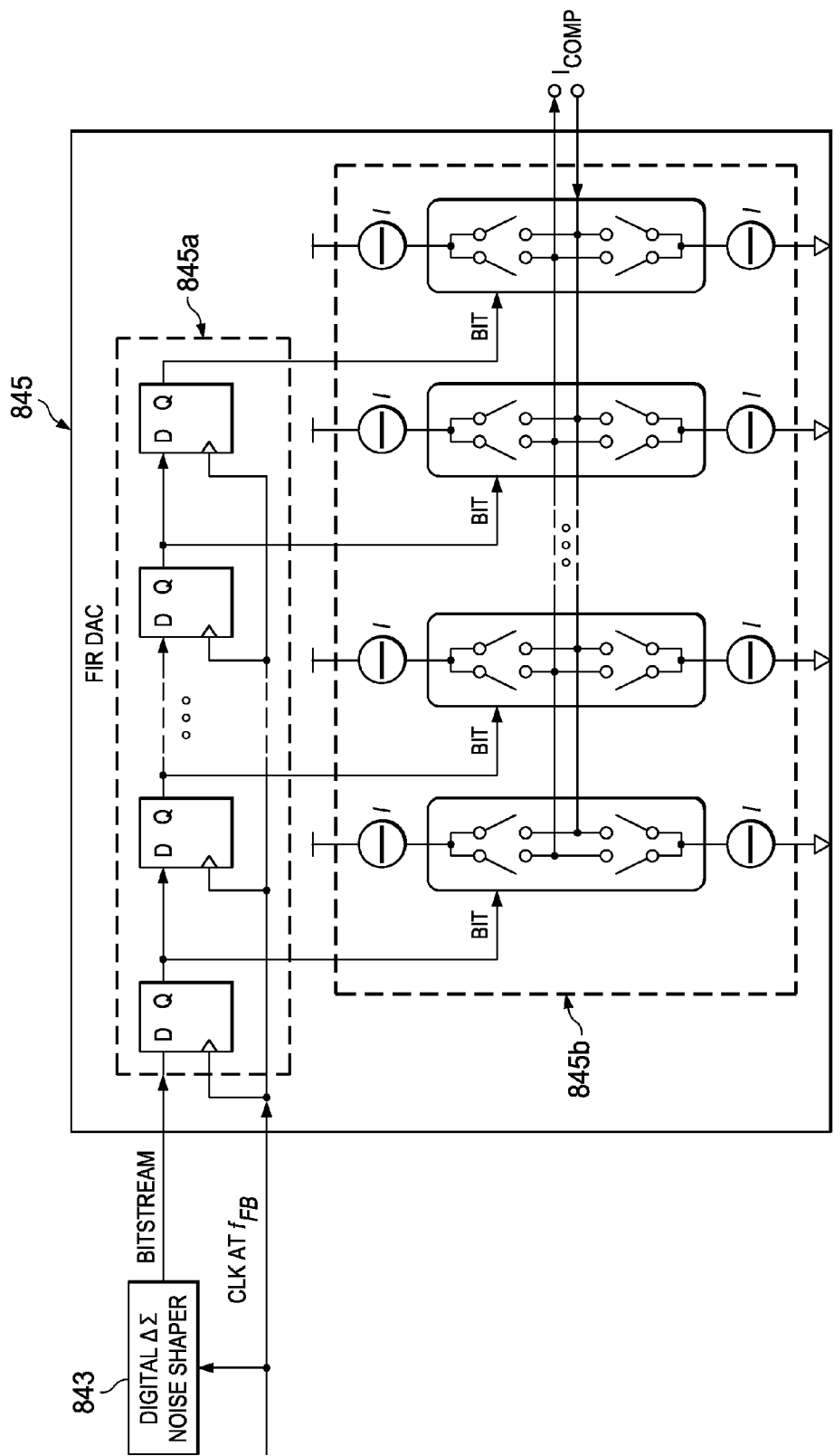
FIG. 8A illustrates an example implementation of a FIR DAC, including FIR filtering, such as can be used in the feedback compensation path of a magnetic-to-digital converter according to the invention.
Figure 8B:
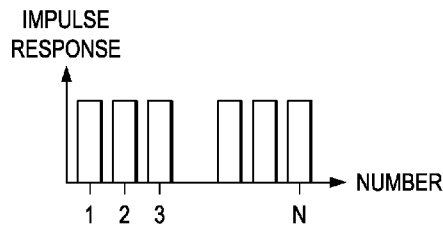
FIGS. 8B and 8C illustrate noise shaping and FIR filtering, including filter notches at $f_{EXC}$ and its harmonics.
Figure 8C:
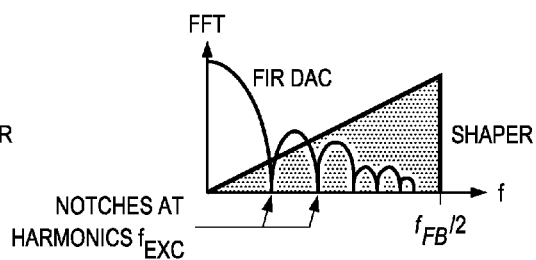
Figure 9A:
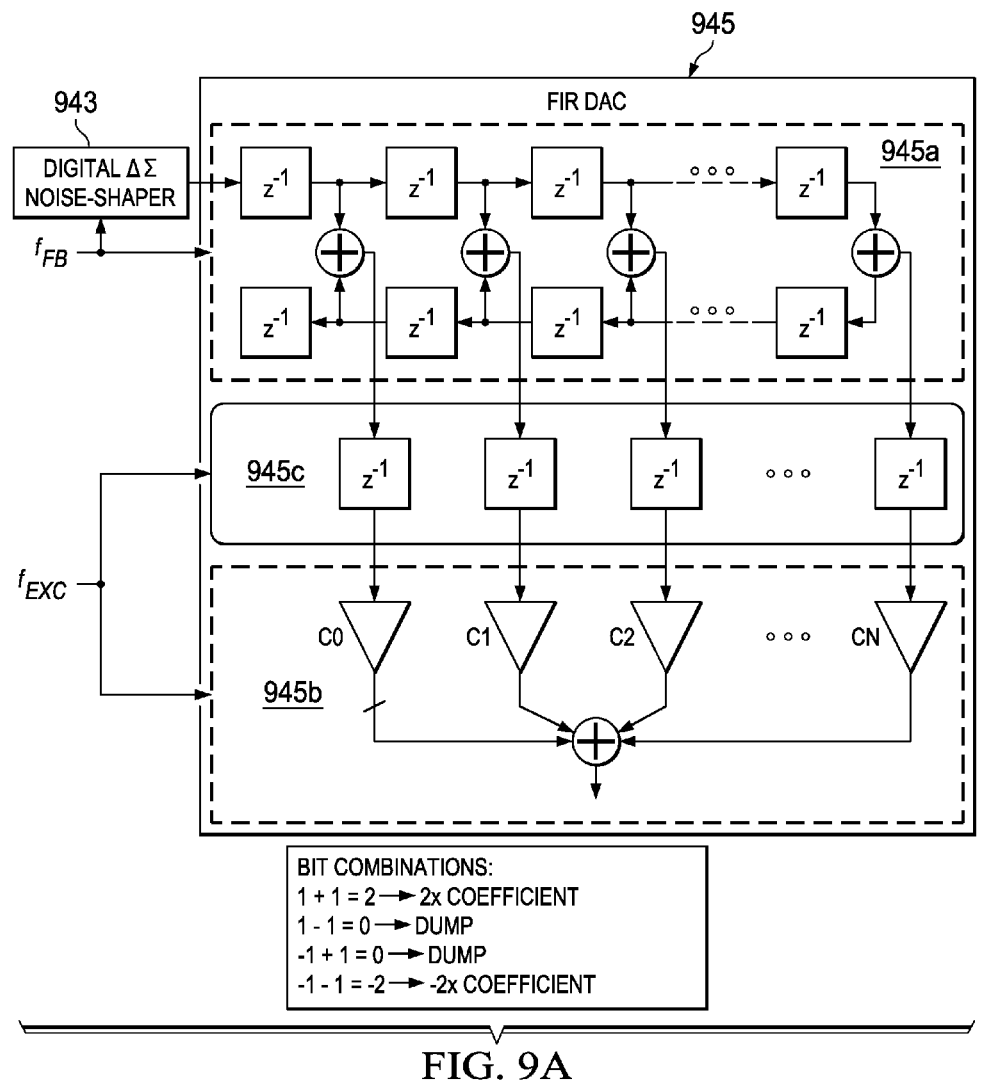
FIG. 9A illustrates an example implementation of a FIR DAC, including FIR filtering, and implementing $I_{COMP}$ synchronization with an integrated digital sample-and-hold clocked by $f_{EXC}$ (or $2 \times f_{EXC}$) so that $I_{COMP}$ transitions occur in synchronization with $f_{EXC}$ (or $2 \times f_{EXC}$), such as can be used in a magnetic-to-digital converter according to the invention, including embodiments in which the forward path is not implemented with an oversampling ADC.

FIGS. 8 and 9A illustrate example implementations of a FIR DAC, such as can be used in the feedback compensation path of a magnetic-to-digital converter according to the invention. For both implementations, the FIR DAC is synchronized with $f_{FB}=(M/N)\times f_S$, where the selection of $f_{FB}$ relative to the oversampling clock $f_S$ is a design choice.

As noted, the FIR filter can be configured for notch filtering if the forward path oversampling frequency $f_S$ is by design choice an integer multiple of the excitation frequency $f_{EXC}$, with filter notches at $f_{EXC}$ and its even harmonics. The FIR DAC can be constructed with flip-flops and current sources, with relaxed matching requirements. The value of the DAC elements define the FIR filter coefficients and can be made of unit elements for improved matching.

FIG. 8 illustrates an example implementation of a FIR DAC 845, synchronized with $f_{FB}=(M/N)\times f_S$, and including a shift register 845a and DAC elements 845b that provide FIR filter coefficients and performs D/A conversion. The input of the FIR DAC is single bit for linearity.

FIG. 9A illustrates an example implementation of a FIR DAC 945, with integrated digital sample-and-hold functionality. such as can be used in a magnetic-to-digital converter according to the invention, including embodiments in which the MDC forward path is not implemented with an oversampling ADC.

FIR DAC 945 includes a shift register 945a, and DAC elements 945b that together form a FIR DAC, providing both FIR filtering and D/A conversion. A digital sample-and-hold 945c, clocked by $f_{EXC}$ (or $2\times f_{EXC}$), is integrated between the FIR filter's main shift register 945a and DAC 945b.

Shift register 945a, clocked by $f_{FB}=(M/N)\times f_S$, is configured to time delay the noise shaped digital data from the preceding noise shaper 943.

Digital sample-and-hold 945c, clocked by $f_{EXC}$ (or $2\times f_{EXC}$), is configured to latch (sample) the time-delayed digital data shifted out of the shift register 945a.

DAC current sources 945b, clocked by $f_{EXC}$ (or $2\times f_{EXC}$), are gain-weighted by FIR filter impulse response coefficients C0, C1, C2, . . . CN.

Shift register 945a and DAC 945b implement a FIR DAC with FIR coefficients C0-CN. This FIR DAC converts the latched data into the $I_{COMP}$ compensation current for injection into the fluxgate compensation coil synchronized with fluxgate core saturation cycles ($f_{EXC}$ or $2\times f_{EXC}$). Because of the symmetrical impulse response of the FIR filter, the FIR shift register can be folded, reducing by half the number of DAC current sources.

As noted, the FIR DAC can be configured for notch filtering if the forward path is implemented with oversampling A/D conversion, and the oversampling frequency $f_S$ is by design choice an integer multiple of the excitation frequency $f_{EXC}$, with filter notches at $f_{EXC}$ and its even harmonics. Advantages of notch filtering include avoiding noise folding due to the sample and hold operation 945c, as well as avoiding the coupling high frequency noise from the noise shaper to the MDC forward path through the fluxgate's magnetic coupling.

Figure 9B:
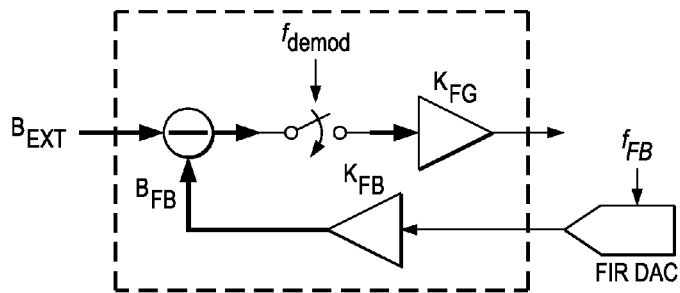
FIGS. 9B-9E illustrate the $I_{COMP}$ synchronization function.
Figure 9C:
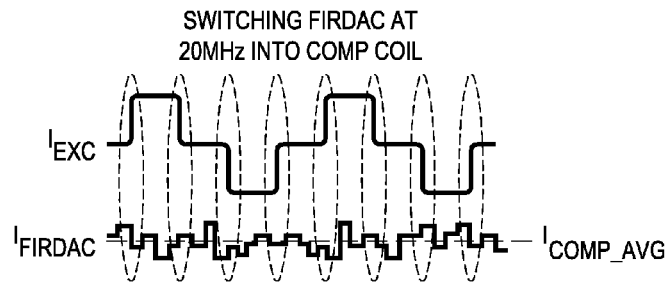
Figure 9D:
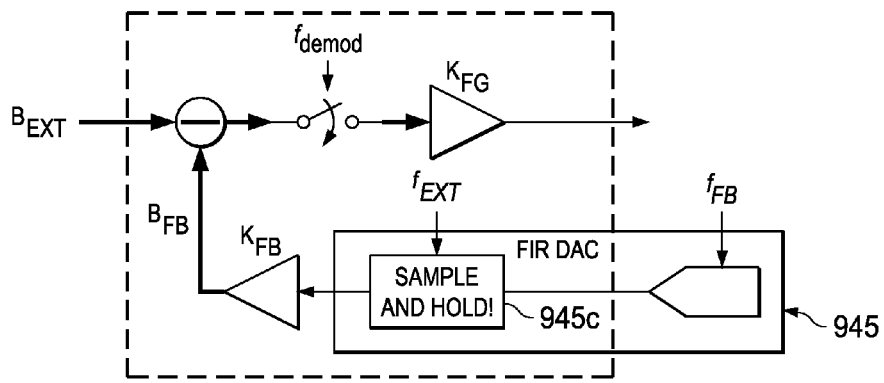
Figure 9E:
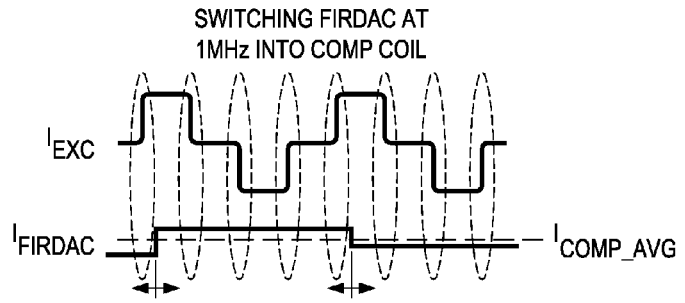

FIGS. 9B-9D illustrate the operation of FIR DAC 945, including the integrated sample-and-hold functionality that synchronizes the $I_{COMP}$ compensation current to fluxgate core saturation cycles.

The Disclosure provided by this Description and the Figures sets forth example embodiments and implementations, including associated operations and methods, that illustrate various aspects and features of the invention. This Disclosure can be used by those skilled in the art as a basis for design modifications, substitutions and alternatives to construct other embodiments, including adaptations for other applications. Accordingly, this Disclosure does not limit the scope of the invention, which is defined by the Claims.

The invention claimed is:

1. A fluxgate sensor circuit adapted to measure an external magnetic field $B_EXT$ with a bandwidth $f_B$ using at least one fluxgate magnetics element including a fluxgate core with an excitation coil, a compensation coil and a sense coil, and disposed such that the external field $B_{EXT}$ magnetically couples into the fluxgate core, comprising:
   drive circuitry to provide to the excitation coil an excitation current $I_{EXC}$ with an excitation frequency $f_{EXC}$; and
   a magnetic-to-digital converter (MDC) control loop, including the fluxgate magnetics element, and including:
      a forward path coupled to receive an analog sense signal output of the fluxgate sense coil induced by a sense field in the fluxgate core that corresponds to a difference between the external field $B_{EXT}$, and a compensation field $B_{COMP}$, and including,
         anti-aliasing circuitry to filter the analog sense signal to provide a low-pass band-limited analog sense signal;
         oversampling data converter circuitry to convert the band-limited analog sense signal to corresponding oversampled digital data based on an oversampling frequency $f_S$ greater than $2f_B$; and
         digital loop filter circuitry synchronized with $f_S$, to filter the oversampled digital data to generate MDC loop output digital data corresponding to sensor data representative of the external field $B_{EXT}$; and
      a feedback path coupled to receive the MDC loop output digital data, and coupled to the fluxgate compensation coil, and including
         feedback compensation circuitry, synchronized with a feedback path frequency $f_{FB}$ equal to $((M/N)\times f_S)$, where, M and N are integers, to generate, in response to the MDC loop output digital data, a compensation current $I_{COMP}$ for injection into the fluxgate compensation coil, to induce the compensation field $B_{COMP}$;
         such that the induced compensation field $B_{COMP}$ nulls the external field $B_{EXT}$, so that the compensation current $I_{COMP}$ corresponds to the sensor data representative of the external field $B_{EXT}$.

2. The circuit of claim 1, wherein the fluxgate sensor circuit is adapted to measure differential components $B_{DM}$ of an external magnetic field $B_{EXT}$ that also includes a stray field common-mode component $B_{CM}$, using two fluxgate magnetics elements including respective magnetic cores with respective excitation, sense and compensation coils, the fluxgate magnetics elements respectively disposed such that differential components $B_{DM}$ of the external field $B_{EXT}$ magnetically couple into the respective fluxgate cores, and:
   drive circuitry to provide to the excitation coils respective excitation currents $I_{EXC}$ each at the excitation frequency $f_{EXC}$;
   further comprising common mode field compensation circuitry coupled to receive analog sense outputs from respective sense coils, to generate analog common-mode compensation currents $I_{COMP,CM}$ that are injected into respective compensation coils to induce respective common-mode compensation fields $B_{COMP,CM}$ to null the common-mode component $B_{CM}$ of the external field $B_{EXT}$;

the MDC control loop to convert the differential components $B_{DM}$ into representative sensor data, based on differential analog sense signal outputs of respective fluxgate sense coils induced by respective sense fields in respective fluxgate cores, each corresponding to a difference between a differential component $B_{DM}$ of the external field $B_{EXT}$, and a respective compensation field $B_{COMP,DM}$; and the feedback compensation circuitry to generate respective differential compensation currents $I_{COMP,DM}$ for injection into respective compensation coils to induce respective compensation fields $B_{COMP,DM}$ to null the corresponding differential component $B_{DM}$ of the external field $B_{EXT}$.

3. The circuit of claim 1, wherein the magnetic field $B_{EXT}$ is induced in the at least one fluxgate magnetics element by a current.

4. The circuit of claim 1, the feedback compensation circuitry to generate the $I_{COMP}$ compensation current synchronized with one of $f_{EXC}$ and $2 \times f_{EXC}$, such that transitions of the $I_{COMP}$ compensation current are synchronized with fluxgate core saturation cycles.

5. The circuit of claim 4, wherein the feedback compensation circuitry comprises:

digital-to-analog conversion circuitry, synchronized with $f_{FB}$ equal to $((M/N) \times f_S)$, to convert the MDC loop output digital data to an analog $I_{COMP}$ signal corresponding to the compensation current $I_{COMP}$; and sample/hold circuitry synchronized with one of $f_{EXC}$ or $2 \times f_{EXC}$, to sample-and-hold the analog $I_{COMP}$ signal such that transitions of the $I_{COMP}$ compensation current are synchronized with fluxgate core saturation cycles.

6. The circuit of claim 4, wherein the feedback compensation circuitry comprises a sigma delta DAC including:

noise shaping circuitry synchronized with $f_{FB}$ equal to $((M/N) \times f_S)$, to noise-shape the MDC loop output digital data to provide noise-shaped digital data;

DAC circuitry to convert the noise-shaped digital data to an analog DAC signal; and a reconstruction filter synchronized with one of $f_{EXC}$ and $2 \times f_{EXC}$, filter the analog DAC signal, and provide the compensation current $I_{COMP}$, such that transitions of the $I_{COMP}$ compensation current are synchronized with fluxgate core saturation cycles.

7. The circuit of claim 4, wherein the feedback compensation circuitry comprises:

noise shaping circuitry synchronized with $f_{FB}$ equal to $((M/N) \times f_S)$, to noise-shape the MDC loop output digital data to output noise-shaped digital data;

FIR DAC circuitry, including time delay circuitry to delay the noise-shaped digital data by a predetermined delay, and provide time-delayed digital data;

digital sample/hold circuitry synchronized with one of $f_{EXC}$ and $2 \times f_{EXC}$, to latch the time-delayed digital data as latched digital data; and a predetermined number of DAC current sources, each gain-weighted by a predetermined FIR filter impulse response coefficient, to convert, synchronous with one of $f_{EXC}$ and $2 \times f_{EXC}$, the latched digital data into the $I_{COMP}$ compensation current, such that transitions of the $I_{COMP}$ compensation current are synchronized with fluxgate core saturation cycles.

8. The circuit of claim 7, wherein the oversampling frequency $f_S$ is an integer multiple of $f_{EXC}$, and the FIR DAC circuitry to FIR filter the noise-shaped digital data including notch filtering to suppress frequency components of $f_{EXC}$ and at least one even harmonic of $f_{EXC}$.

9. The circuit of claim 7, wherein the FIR DAC circuitry is folded according to the symmetrical impulse response to FIR filtering the noise-shaped digital data.

10. The circuit of claim 1, wherein the anti-aliasing circuitry and the oversampling data converter circuitry comprise a continuous time sigma-delta converter.

11. The circuit of claim 1, wherein the oversampling frequency is an integer multiple of $f_{EXC}$, and the digital loop filter to filter the oversampled digital data including notch filtering to suppress frequency components of $f_{EXC}$ and at least one even harmonic $f_{EXC}$.

12. The circuit of claim 1, further comprising amplifier circuitry coupled to the input to the oversampling data converter circuitry, to introduce a predetermined gain to reduce input referred quantization noise;

the oversampling data converter circuitry to convert an analog sense signal that is band-limited by the anti-aliasing circuitry and amplified by the amplifier circuitry.

13. A fluxgate sensor system adapted to measure an external magnetic field $B_{EXT}$ with a bandwidth $f_B$, comprising at least one fluxgate magnetics element including a fluxgate core with an excitation coil, a compensation coil and a sense coil, and disposed such that the external field $B_{EXT}$ magnetically couples into the fluxgate core;

drive circuitry to provide to the excitation coil an excitation current $I_{EXC}$ with an excitation frequency $f_{EXC}$; and a magnetic-to-digital converter (MDC) control loop, including the fluxgate magnetics element, including:

a forward path coupled to receive an analog sense signal output of the fluxgate sense coil induced by a sense field in the fluxgate core that corresponds to a difference between the external field $B_{EXT}$, and a compensation field $B_{COMP}$, and including, aliasing circuitry to filter the analog sense signal to provide a low-pass band-limited analog sense signal;

oversampling data converter circuitry to convert the band-limited analog sense signal to corresponding oversampled digital data based on an oversampling frequency $f_S$ greater than $2f_B$; and digital loop filter circuitry synchronized with $f_S$, to filter the oversampled digital data to generate MDC loop output digital data corresponding to sensor data representative of the external field $B_{EXT}$; and a feedback path coupled to receive the MDC loop output digital data, and coupled to the fluxgate compensation coil, and including feedback compensation circuitry, synchronized with a feedback path frequency $f_{FB}$ equal to $((M/N) \times f_S)$, where, M and N are integers, to generate, in response to the MDC loop output digital data, a compensation current $I_{COMP}$ for injection into the fluxgate compensation coil, to induce the compensation field $B_{COMP}$;

such that the induced compensation field $B_{COMP}$ nulls the external field $B_{EXT}$, so that the compensation current $I_{COMP}$ corresponds to the sensor data representative of the external field $B_{EXT}$.

14. The system of claim 13, wherein the fluxgate sensor circuit is adapted to measure differential components $B_{DM}$ of an external magnetic field $B_{EXT}$ that also includes a stray field common-mode component $B_{CM}$, using two fluxgate magnetics elements including respective magnetic cores with respective excitation, sense and compensation coils, the fluxgate magnetics elements respectively disposed such that differential components $B_{DM}$ of the external field $B_{EXT}$ magnetically couple into the respective fluxgate cores, and:
the drive circuitry to provide to the excitation coils respective excitation currents $I_{EXC}$ each at the excitation frequency $f_{EXC}$;
further comprising common mode field compensation circuitry coupled to receive analog sense outputs from respective sense coils, to generate common-mode analog compensation currents $I_{COMP,CM}$ that are injected into respective compensation coils to induce respective common-mode compensation fields $B_{COMP,CM}$ to null the common-mode component $B_{CM}$ of the external field $B_{EXT}$;
the MDC control loop to convert the differential components $B_{DM}$ into representative sensor data, based on differential analog sense signal outputs of respective fluxgate sense coils induced by respective sense fields in respective fluxgate cores, each corresponding to a difference between a differential component $B_{DM}$ of the external field $B_{EXT}$, and a respective compensation field $B_{COMP,DM}$;
the feedback compensation circuitry to generate respective differential compensation currents $I_{COMP,DM}$ for injection into respective compensation coils to induce respective compensation fields $B_{COMP,DM}$ to null the corresponding differential component $B_{DM}$ of the external field $B_{EXT}$.

15. The system of claim 13, wherein the magnetic field $B_{EXT}$ is induced in the at least one fluxgate magnetics element by a current.

16. The system of claim 13, the feedback compensation circuitry to generate the $I_{COMP}$ compensation current synchronized with one of $f_{EXC}$ and 2×fEXC, such that transitions of the $I_{COMP}$ compensation current are synchronized with fluxgate core saturation cycles.

17. The system of claim 16, wherein the feedback compensation circuitry comprises:
digital-to-analog conversion circuitry, synchronized with $f_{FB}$ equal to ((M/N)×$f_S$), to convert the MDC loop output digital data to an analog $I_{COMP}$ signal corresponding to the compensation current $I_{COMP}$; and
sample/hold circuitry synchronized with one of $f_{EXC}$ or 2×$f_{EXC}$, to sample-and-hold the analog $I_{COMP}$ signal such that transitions of the $I_{COMP}$ compensation current are synchronized with fluxgate core saturation cycles.

18. The system of claim 16, wherein the feedback compensation circuitry comprises a sigma delta DAC including:
noise shaping circuitry synchronized with $f_{FB}$ equal to ((M/N)×$f_S$), to noise-shape the MDC loop output digital data to provide noise-shaped digital data;
DAC circuitry to convert the noise-shaped digital data to an analog DAC signal; and
a reconstruction filter synchronized with one of $f_{EXC}$ and 2×$f_{EXC}$, to filter the analog DAC signal, and provide the compensation current $I_{COMP}$, such that transitions of the $I_{COMP}$ compensation current are synchronized with fluxgate core saturation cycles.

19. The system of claim 16, wherein the feedback compensation circuitry comprises:
noise shaping circuitry synchronized with $f_{FB}$ equal to ((M/N)×$f_S$), to noise-shape the MDC loop output digital data to output noise-shaped digital data;
FIR DAC circuitry, including
time delay circuitry to delay the noise-shaped digital data by a predetermined delay, and provide time-delayed digital data;
digital sample/hold circuitry synchronized with one of $f_{EXC}$ and 2×$f_{EXC}$, to latch the time-delayed digital data as latched digital data; and
a predetermined number of DAC current sources, each gain-weighted by a predetermined FIR filter impulse response coefficient, to convert, synchronous with one of $f_{EXC}$ and 2×$f_{EXC}$, the latched digital data into the $I_{COMP}$ compensation current, such that transitions of the $I_{COMP}$ compensation current are synchronized with fluxgate core saturation cycles.

20. The system of claim 19, wherein the oversampling frequency $f_S$ is an integer multiple of $f_{EXC}$, and
the FIR DAC circuitry to FIR filter the noise-shaped digital data including notch filtering to suppress frequency components of $f_{EXC}$ and at least one even harmonic of $f_{EXC}$.

21. The system of claim 19,
wherein the FIR DAC circuitry is folded according to the symmetrical impulse response to FIR filtering the noise-shaped digital data.

22. The system of claim 13, wherein the anti-aliasing circuitry and the oversampling data converter circuitry comprise a continuous time sigma-delta converter.

23. The system of claim 13, wherein the oversampling frequency is an integer multiple of $f_{EXC}$, and
the digital loop filter to filter the oversampled digital data including notch filtering to suppress frequency components of $f_{EXC}$ and at least one even harmonic $f_{EXC}$.

24. The system of claim 13, further comprising
amplifier circuitry coupled to the input to the oversampling data converter circuitry, to introduce a predetermined gain to reduce input referred quantization noise;
the oversampling data converter circuitry to convert an analog sense signal that is band-limited by the anti-aliasing circuitry and amplified by the amplifier circuitry.

25. A method of measuring an external magnetic field $B_{EXT}$ with a bandwidth $f_B$, useable with a fluxgate sensor with at least one fluxgate magnetics element including a fluxgate core with an excitation coil, a compensation coil and a sense coil, where the fluxgate sensor is disposed such that the external field $B_{EXT}$ magnetically couples into the fluxgate core, comprising:
driving the fluxgate excitation coil with an excitation current $I_{EXC}$ with an excitation frequency $f_{EXC}$;
receiving from the fluxgate sense coil an analog sense signal induced by a sense field in the fluxgate core that corresponds to a difference between the external field $B_{EXT}$, and a compensation field $B_{COMP}$;
converting the analog sense signal into loop output digital data corresponding to sensor data representative of the external field $B_{EXT}$, including:
converting the analog sense signal to corresponding oversampled digital data based on oversampling data conversion with an oversampling frequency $f_S$ greater than 2$f_B$; and loop filtering the oversampled digital data, synchronous with the oversampling frequency $f_S$, to generate the loop output digital data; and converting the loop output digital data into a feedback compensation current $I_{COMP}$ corresponding to the sensor data representative of the external field $B_{EXT}$, including generating the feedback compensation current $I_{COMP}$ from the loop output digital data, synchronous with a feedback path frequency $f_{FB}$ equal to $((M/N) \times f_S)$, where, M and N are integers; and injecting the feedback compensation current $I_{COMP}$ into the fluxgate compensation coil to induce the compensation field $B_{COMP}$, such that the induced compensation field $B_{COMP}$ nulls the external field $B_{EXT}$.

26. The method of claim 25,
further comprising band limiting the analog sense signal to prevent aliasing; and
wherein the band-limited analog sense signal is converted to corresponding oversampled digital data.

27. The method of claim 25, adapted to measure differential components $B_{DM}$ of an external magnetic field $B_{EXT}$ that also includes a stray field common-mode component $B_{CM}$, using two fluxgate magnetics elements including respective magnetic cores with respective excitation, sense and compensation coils, wherein respective excitation coils are driven with respective excitation currents $I_{EXC}$ each at the excitation frequency $f_{EXC}$, and wherein the fluxgate magnetics elements are respectively disposed such that differential components $B_{DM}$ of the external field $B_{EXT}$ magnetically couple into the respective fluxgate cores, and:

further comprising generating, from the analog sense outputs from respective sense coils, common-mode analog compensation currents $I_{COMP,CM}$ that are injected into respective compensation coils to induce respective common-mode compensation fields $B_{COMP,CM}$ to null the common-mode component $B_{CM}$ of the external field $B_{EXT}$;

wherein the differential components $B_{DM}$ are converted into representative sensor data, based on differential analog sense signal outputs of respective fluxgate sense coils induced by respective sense fields in respective fluxgate cores, each corresponding to a difference between a differential component $B_{DM}$ of the external field $B_{EXT}$, and a respective compensation field $B_{COMP,DM}$; and wherein respective differential feedback compensation currents $I_{COMP,DM}$ are injected into respective compensation coils to induce respective compensation fields $B_{COMP,DM}$ to null the corresponding differential component $B_{DM}$ of the external field $B_{EXT}$.

28. The method of claim 25, wherein the magnetic field $B_{EXT}$ is induced in the at least one fluxgate magnetics element by a current.

29. The method of claim 25, further comprising synchronizing the feedback $I_{COMP}$ compensation current with one of $f_{EXC}$ and $2 \times fEXC$, such that transitions of the feedback $I_{COMP}$ compensation current are synchronized with fluxgate core saturation cycles.

30. The method of claim 25, wherein converting the loop output digital data into the feedback compensation current $I_{COMP}$ is accomplished by:

noise-shaping the MDC loop output digital data, synchronized with $f_{FB}$ equal to $((M/N) \times f_S)$, to provide noise-shaped digital data;

delaying the noise-shaped digital data by a predetermined delay, and providing time-delayed digital data;

performing a sample-and-hold operation, synchronized with one of $f_{EXC}$ and $2 \times f_{EXC}$, to latch the time-delayed digital data as latched digital data; and converting the latched digital data into the feedback $I_{COMP}$ compensation current, synchronous with one of $f_{EXC}$ and $2 \times f_{EXC}$, using a predetermined number of DAC current sources, each gain-weighted by a predetermined FIR filter impulse response coefficient, such that transitions of the $I_{COMP}$ compensation current are synchronized with fluxgate core saturation cycles.

31. The method of claim 30, wherein the oversampling frequency $f_S$ is an integer multiple of $f_{EXC}$, and further comprising at least one of: (a) notch filtering the oversampled digital data to suppress frequency components of $f_{EXC}$ and at least one even harmonic $f_{EXC}$, and (b) notch filtering the noise-shaped digital data to suppress frequency components of $f_{EXC}$ and at least one even harmonic of $f_{EXC}$.

* * * * *